US010622063B2

(12) United States Patent
Grobis et al.

(10) Patent No.: US 10,622,063 B2
(45) Date of Patent: Apr. 14, 2020

(54) PHASE CHANGE MEMORY DEVICE WITH REDUCED READ DISTURB AND METHOD OF MAKING THE SAME

(71) Applicant: SANDISK TECHNOLOGIES LLC, Addison, TX (US)

(72) Inventors: Michael Grobis, Campbell, CA (US); Zhaoqiang Bai, San Jose, CA (US); Ward Parkinson, Boise, ID (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/019,745

(22) Filed: Jun. 27, 2018

(65) Prior Publication Data

US 2020/0005863 A1    Jan. 2, 2020

(51) Int. Cl.
*G11C 13/00* (2006.01)
*H01L 45/00* (2006.01)
*H01L 27/24* (2006.01)

(52) U.S. Cl.
CPC ........ *G11C 13/004* (2013.01); *G11C 13/0004* (2013.01); *G11C 13/0069* (2013.01); *H01L 27/2481* (2013.01); *H01L 45/06* (2013.01); *H01L 45/1253* (2013.01); *H01L 45/1675* (2013.01); *G11C 2013/0045* (2013.01); *G11C 2013/0078* (2013.01); *H01L 45/141* (2013.01); *H01L 45/1616* (2013.01)

(58) Field of Classification Search
CPC .............. G11C 13/004; G11C 13/0069; G11C 11/1675; G11C 13/0004; G11C 2013/0078; G11C 2013/0045; H01L 27/2481; H01L 45/06; H01L 45/1293
See application file for complete search history.

(56) References Cited

U.S. PATENT DOCUMENTS

| 7,759,666 | B2 | 7/2010 | Kumar et al. |
| 7,800,932 | B2 | 9/2010 | Kumar et al. |
| 7,800,933 | B2 | 9/2010 | Kumar et al. |
| 7,800,934 | B2 | 9/2010 | Kumar et al. |
| 7,859,887 | B2 | 12/2010 | Chen et al. |
| 8,097,498 | B2 | 1/2012 | Purayath et al. |
| 9,177,966 | B1 | 11/2015 | Rabkin et al. |
| 10,305,036 | B2 * | 5/2019 | Boniardi ............. H01L 45/1293 |

(Continued)

OTHER PUBLICATIONS

Lee, J. et al., "Impact of Thermoelectric Phenomena on Phase-Change Memory Performance Metrics and Scaling," Nanotechnology, No. 23, pp. 1-7, (2012).

(Continued)

*Primary Examiner* — David Lam
(74) *Attorney, Agent, or Firm* — The Marbury Law Group PLLC

(57) ABSTRACT

A method of operating a phase change memory device includes flowing a write current of a first polarity through a phase change memory element of a selected phase change memory cell, and flowing a read current of a second polarity opposite to the first polarity through the phase change memory element of the selected phase change memory cell. A first junction between the phase change memory element and a first electrode and a second junction between the phase change memory element and a second electrode exhibit asymmetric thermoelectric heat generation during the step of flowing the write current.

16 Claims, 17 Drawing Sheets

(56) References Cited

U.S. PATENT DOCUMENTS

| | | | |
|---|---|---|---|
| 2007/0164388 A1 | 7/2007 | Kumar et al. | |
| 2009/0168504 A1 | 7/2009 | Lee et al. | |
| 2009/0323409 A1* | 12/2009 | Lin | G11C 13/0004 |
| | | | 365/163 |
| 2011/0007545 A1* | 1/2011 | Jin | G11C 11/16 |
| | | | 365/148 |
| 2016/0180931 A1 | 6/2016 | Redaelli | |
| 2017/0207273 A1* | 7/2017 | Sciarrillo | H01L 45/04 |

OTHER PUBLICATIONS

U.S. Appl. No. 15/478,637, filed Apr. 4, 2017, SanDisk Technologies LLC.
U.S. Appl. No. 15/843,777, filed Dec. 15, 2017, SanDisk Technologies LLC.
U.S. Appl. No. 15/844,005, filed Dec. 15, 2017, SanDisk Technologies LLC.
U.S. Appl. No. 15/888,645, filed Feb. 5, 2018, SanDisk Technologies LLC.
U.S. Appl. No. 15/898,571, filed Feb. 17, 2018, SanDisk Technologies LLC.
U.S. Appl. No. 15/901,633, filed Feb. 28, 2018, SanDisk Technologies LLC.
U.S. Appl. No. 15/924,944, filed Mar. 19, 2018, SanDisk Technologies LLC.
U.S. Appl. No. 15/996,738, filed Jun. 4, 2018, SanDisk Technologies LLC.
U.S. Appl. No. 16/002,169, filed Jun. 7, 2018, SanDisk Technologies LLC.
U.S. Appl. No. 16/002,243, filed Jun. 7, 2018, SanDisk Technologies LLC.
Notification of Transmittal of the International Search Report and Written Opinion of the International Search Authority or International Patent Application No. PCT/US2019/018109, dated May 28, 2019, 2 pages.
International Search Report from the International Searching Authority for International Patent Application No. PCT/US2019/018109, dated May 28, 2019, 3 pages.
Written Opinion of the International Searching Authority for International Patent Application No. PCT/US2019/018109, dated May 28, 2019, 6 pages.

* cited by examiner

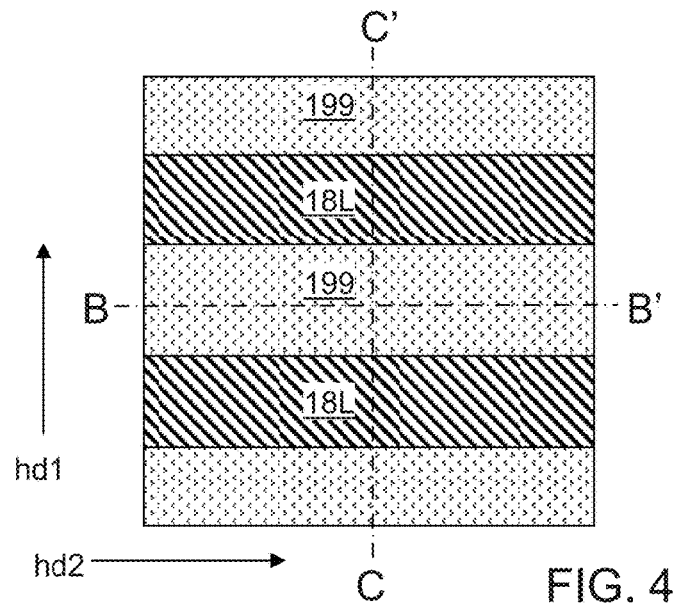
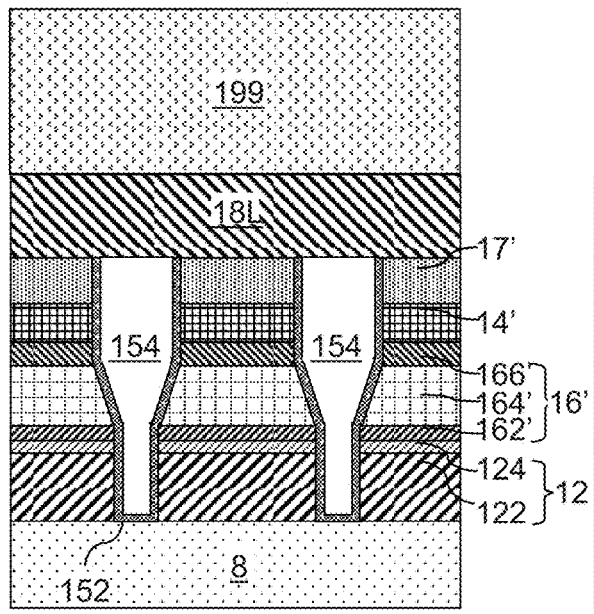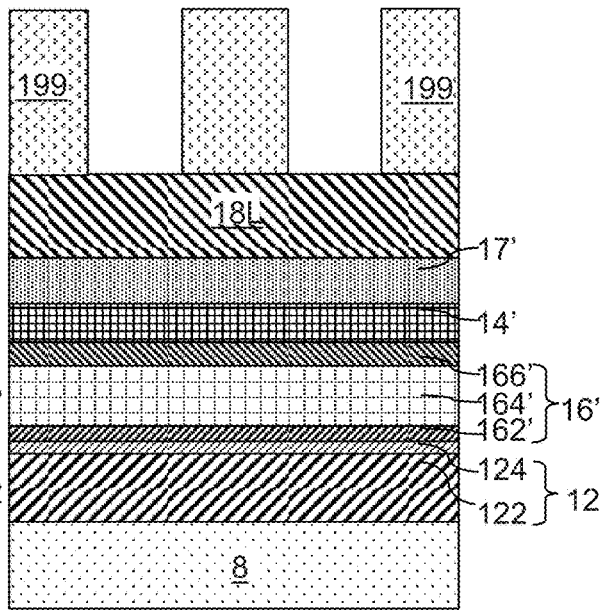
FIG. 4A
FIG. 4B
FIG. 4C

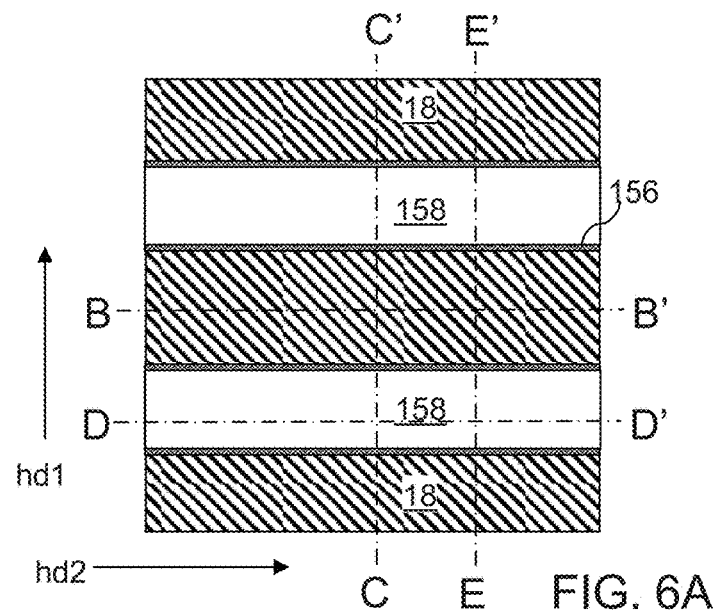
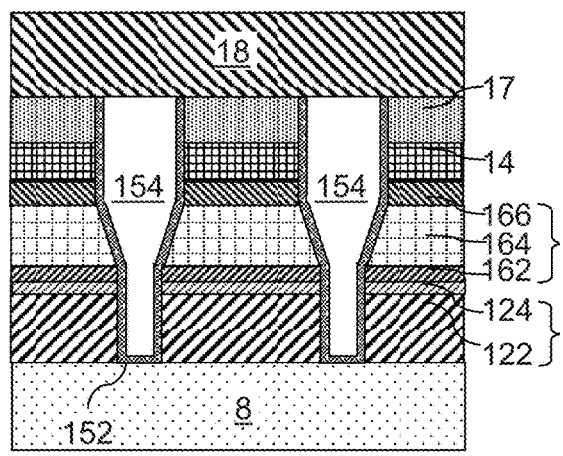
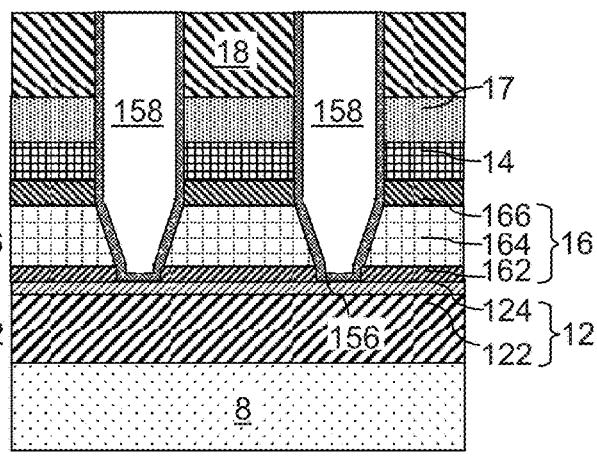
FIG. 6B    FIG. 6C

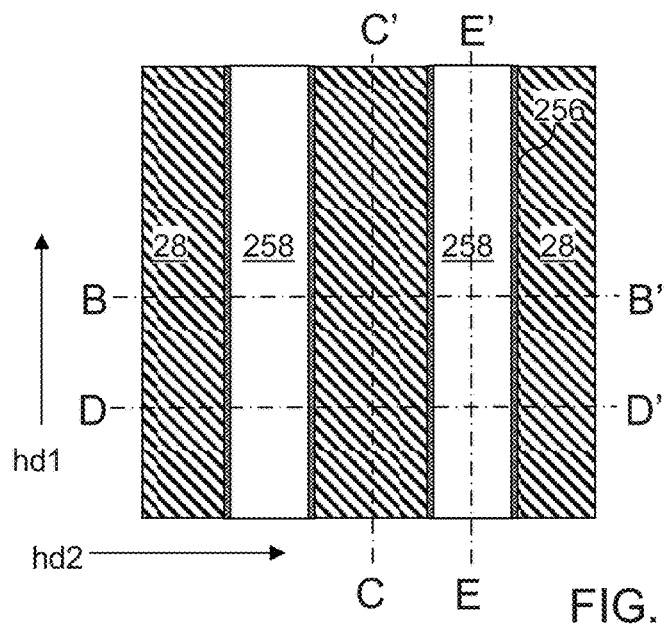
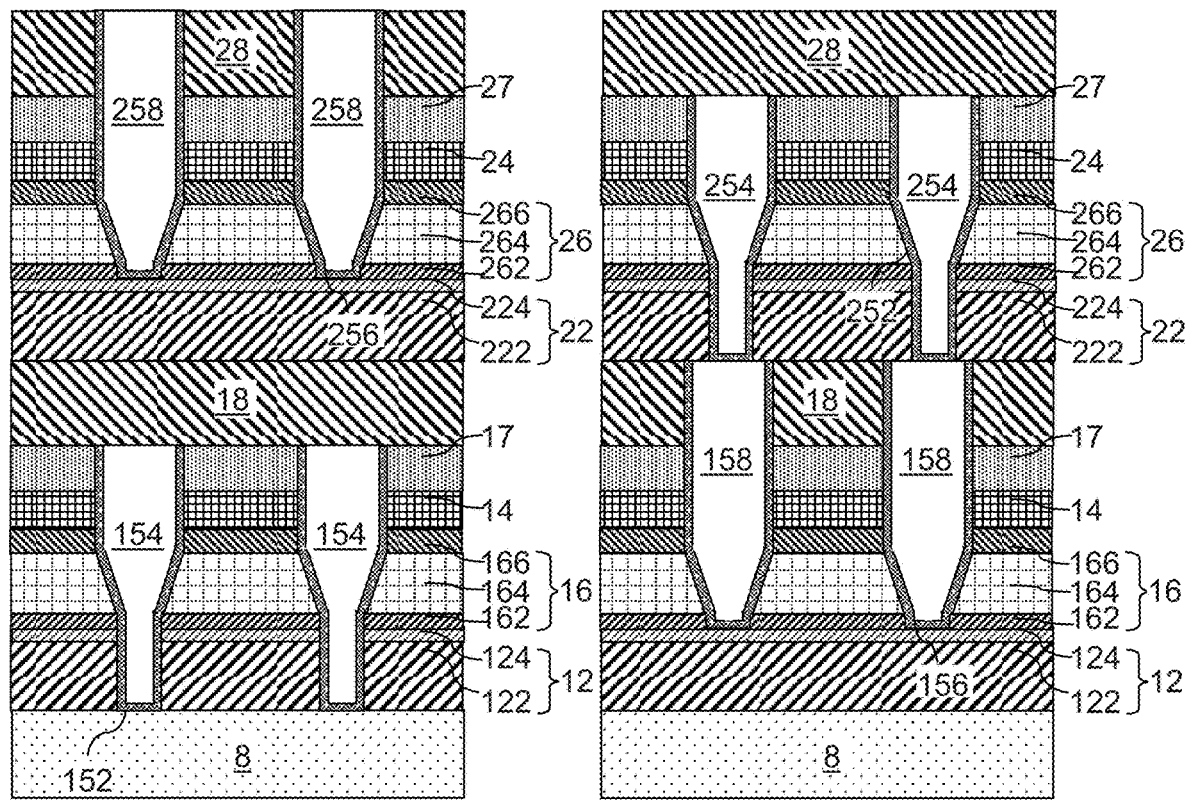
FIG. 7A
FIG. 7B
FIG. 7C

PHASE CHANGE MEMORY DEVICE WITH REDUCED READ DISTURB AND METHOD OF MAKING THE SAME

FIELD

The present disclosure relates generally to the field of semiconductor devices and specifically to a memory device including phase change memory cells with reduced read disturb and methods of forming the same.

BACKGROUND

A phase change material (PCM) memory device (also known as a phase change random access memory "PCRAM" or "PRAM") is a type of non-volatile memory device that stores information as a resistive state of a material that can be in different resistive states corresponding to different phases of the material. The different phases can include an amorphous state having high resistivity and a crystalline state having low resistivity (i.e., a lower resistivity than in the amorphous state). The transition between the amorphous state and the crystalline state can be induced by controlling the rate of cooling after application of an electrical pulse that renders the phase change memory material amorphous in a first part of a programming process. The second part of the programming process includes control of the cooling rate of the phase change memory material. If rapid quenching occurs, the phase change memory material can cool into an amorphous high resistivity state. If slow cooling occurs, the phase change memory material can cool into a crystalline low resistivity state.

SUMMARY

According to an aspect of the present disclosure, a phase change memory device includes at least one phase change memory cell, wherein each of the at least one phase change memory cell comprises a phase change memory element located between a first electrode and a second electrode, and wherein a first junction between the phase change memory element and the first electrode and a second junction between the phase change memory element and the second electrode have asymmetric thermoelectric heat generation upon passing electrical current through the phase change memory element. The device also includes a programming and sensing circuitry configured to flow a write current of a first polarity through the phase change memory element of the at least one phase change memory cell, and a read current of a second polarity opposite to the first polarity through the phase change memory element of the at least one phase change memory cell.

According to another aspect of the present disclosure, a method of operating a phase change memory device includes flowing a write current of a first polarity through a phase change memory element of a selected phase change memory cell, and flowing a read current of a second polarity opposite to the first polarity through the phase change memory element of the selected phase change memory cell. A first junction between the phase change memory element and a first electrode and a second junction between the phase change memory element and a second electrode exhibit asymmetric thermoelectric heat generation during the step of flowing the write current.

BRIEF DESCRIPTION OF THE DRAWINGS

FIG. 4A is a top-down view of the exemplary structure after formation of a first top conductive layer and a patterned second photoresist layer over the first stacked rail structures and the lower first-level dielectric isolation structures according to an embodiment of the present disclosure.

FIG. 4B is a vertical cross-sectional view of the exemplary structure along the vertical plane B-B' of FIG. 4A.

FIG. 4C is a vertical cross-sectional view of the exemplary structure along the vertical plane C-C' of FIG. 4A.

FIG. 6A is a top-down view of the exemplary structure after formation of upper first-level dielectric isolation structures according to an embodiment of the present disclosure.

FIG. 6B is a vertical cross-sectional view of the exemplary structure along the vertical plane B-B' of FIG. 6A.

FIG. 6C is a vertical cross-sectional view of the exemplary structure along the vertical plane C-C' of FIG. 6A.

FIG. 7A is a top-down view of the exemplary structure after formation of a second-level structure according to an embodiment of the present disclosure.

FIG. 7B is a vertical cross-sectional view of the exemplary structure along the vertical plane B-B' of FIG. 7A.

FIG. 7C is a vertical cross-sectional view of the exemplary structure along the vertical plane C-C' of FIG. 7A.

DETAILED DESCRIPTION

Figure 1A:
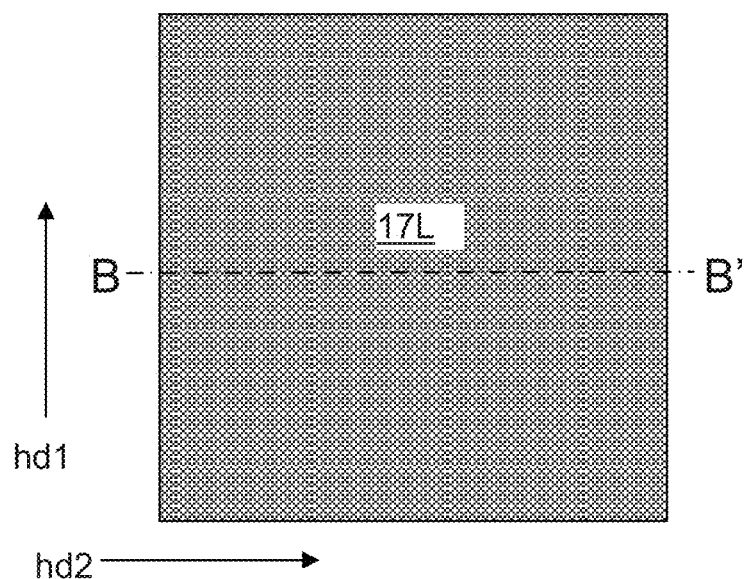
FIG. 1A is a top-down view of an exemplary structure for forming a three-dimensional phase change memory device after formation of a first layer stack including a first bottom conductive layer, a first phase change memory layer, a first selector layer, and an optional first barrier layer according to an embodiment of the present disclosure.

Data stored in a phase change memory element can be based on the threshold voltage of the phase change memory element or the resistance of the phase change memory element. Phase change memory elements can be susceptible to read disturb, which refers to unintended modification of the state of the phase change memory material caused during reading of the bit state or the resistance state of the phase change memory element. Read disturb can cause bit errors, which result in loss of information in case the bit value is unintentionally changed from set to reset or vice versa upon reading. For neuromorphic or machine learning applications, the absolute resistance of a phase change memory element is important, which may be changed due to read disturb.

Embodiments of the present disclosure provide a phase change memory device with reduced read disturb and methods of forming the same, the various aspects of which are described below. In one embodiment, the read disturb is reduced by applying read and write currents with opposite polarity to phase change memory cells exhibiting thermoelectric heating. The drawings are not drawn to scale. Multiple instances of an element may be duplicated where a single instance of the element is illustrated, unless absence of duplication of elements is expressly described or clearly indicated otherwise. Unless otherwise indicated, a "contact" between elements refers to a direct contact between elements that provides an edge or a surface shared by the elements. Ordinals such as "first," "second," and "third" are employed merely to identify similar elements, and different ordinals may be employed across the specification and the claims of the instant disclosure. A same reference numeral refers to a same element or a similar element. Unless otherwise noted, elements with a same reference numeral are presumed to have a same material composition. As used herein, all thermoelectric properties and thermal properties are measured at 300 degrees Celsius unless otherwise specified. Consequently, the reference temperature (i.e., measurement temperature) for asymmetric thermoelectric heat generation and other thermoelectrical properties and thermal properties is 300 degrees Celsius in the specification and in the claims unless expressly specified otherwise.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Figure 1B:
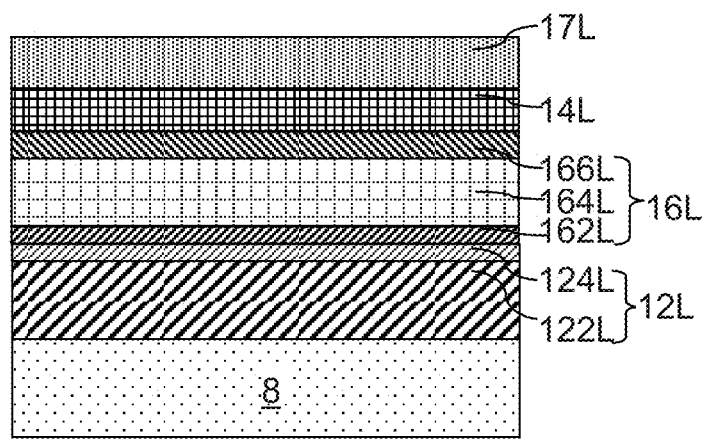
FIG. 1B is a vertical cross-sectional view of the exemplary structure along the vertical plane B-B' of FIG. 1A.

Referring to FIGS. 1A and 1B, an exemplary structure for forming a three-dimensional phase change memory device is illustrated, which includes a substrate 8. The substrate 8 includes an insulating material layer in an upper portion, and may optionally include additional layers (not illustrated) underneath, which can include, for example, a semiconductor material layer and interconnect level dielectric layers embedding metal interconnect structures therein. In one embodiment, semiconductor devices such as field effect transistors may be provided on the semiconductor material layer, and the metal interconnect structures can provide electrically conductive paths among the semiconductor devices. The exemplary structure includes a memory array region, which is illustrated herein, and a peripheral region (not illustrated) including interconnect structures and/or peripheral devices. Memory cells are subsequently formed in the memory array region.

A first vertical stack (12L, 16L, 14L, 17L), which is also referred to as a first layer stack, is formed over the substrate 8. The substrate 8 can include additional structures and circuitry required for operation of the memory arrays. The first vertical stack (12L, 16L, 14L, 17L) can include a first bottom conductive layer 12L, a first phase change memory layer 16L, a first selector layer 14L, and an optional first barrier layer 17L. Each layer in the first vertical stack (12L, 16L, 14L, 17L) can be formed as a blanket material layer, i.e., an unpatterned material layer that laterally extend along a first horizontal direction hd1 and a second horizontal direction hd2 that is perpendicular to the first horizontal direction hd1.

The first bottom conductive layer 12L includes at least one conductive material layer, which can be at least one metallic material layer. For example, the first bottom conductive layer 12L can include a layer stack, from bottom to top, of a first metal layer 122L (such as a tungsten layer) and a first electrode buffer layer 124L (such as a tungsten nitride layer, a titanium nitride layer, a carbon layer, a carbon layer, or combination thereof). The thickness of the first metal layer 122L can be in a range from 20 nm to 100 nm, such as from 30 nm to 70 nm, although lesser and greater thicknesses can also be employed. The thickness of the first electrode buffer layer 124L can be in a range from 1 nm to 10 nm, such as from 1.5 nm to 5 nm, although lesser and greater thicknesses can also be employed.

The first phase change memory layer 16L includes a first phase change memory material layer 164L. The first phase change memory material layer 164L include a phase change memory material. As used herein, a "phase change memory material" refers to a material having at least two different phases providing different resistivity. The at least two different phases can be provided, for example, by controlling the rate of cooling from a heated state to provide an amorphous state having a higher resistivity and a polycrystalline state having a lower resistivity. In this case, the higher resistivity state of the phase change memory material can be achieved by faster quenching of the phase change memory material after heating to an amorphous state, and the lower resistivity state of the phase change memory material can be achieved by slower cooling of the phase change memory material after heating to the amorphous state Exemplary phase change memory materials include, but are not limited to, germanium antimony telluride compounds such as $Ge_2Sb_2Te_5$ (GST), germanium antimony compounds, indium germanium telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the phase change memory material layer can include, and/or can consist essentially of, a material selected from a germanium antimony telluride compound, a germanium antimony compound, an indium germanium telluride compound, an aluminum selenium telluride compound, an indium selenium telluride compound, or an aluminum indium selenium telluride compound. The thickness of the first phase change memory material layer 164L can be in a range from 1 nm to 60 nm, such as from 10 nm to 50 nm and/or from 20 nm to 40 nm, although lesser and greater thicknesses can also be employed.

The first phase change memory layer 16L can optionally include a first lower conductive liner layer 162L underlying the first phase change memory material layer 164L, and can optionally include a first upper conductive liner layer 166L overlying the first phase change memory material layer 164L. The first phase change material has a Seebeck coefficient $S_{PCM}$, the first lower conductive thermal control layer 162L has a Seebeck coefficient $S_{LL}$, and the upper conductive thermal control layer 166L has a Seebeck coefficient $S_{UL}$. In one embodiment $S_{LL} > S_{UL}$ and the control circuitry is configured so that current flows from the upper conductive thermal control layer 166L to the lower conductive thermal control layer 162L when reading the state of the phase change material layer 164L and in the opposite direction when modifying the state of the phase change material layer 164L. In one embodiment $S_{LL}$ is at least 30 microvolts per Kelvin greater than $S_{UL}$ at the operating temperature range during programming, which can be in a range from 200 degrees Celsius to 700 degrees Celsius. As a proxy for the differences in the Seebeck coefficients in the temperature range, the elevated temperature of 300 degrees may be employed. In one embodiment $S_{LL}$ is at least 30 microvolts per Kelvin greater than $S_{UL}$ at the 300 degrees Celsius. In another embodiment, the first lower conductive thermal control layer 162L has a larger cross-sectional area than the first upper conductive thermal control layer 166L, $S_{LL}$ is approximately equal to or greater than $S_{UL}$, but less than $S_{PCM}$, and the control circuitry is configured so that current flows from the upper conductive thermal control layer 166L to the lower conductive thermal control layer 162L when reading the state of the phase change material layer 164L and in the opposite direction when modifying the state of the phase change material layer 164L.

In one embodiment, the first lower conductive thermal control layer 162L can include a conductive metallic nitride such as titanium nitride, tungsten or tungsten nitride, and/or selenium, tellurium, doped silicon, germanium, or an alloy and/or a highly thermally conductive material such as silver, copper, and/or aluminum. In one embodiment, the first upper conductive thermal control layer 166L can include a conductive metallic nitride such as titanium nitride, tantalum nitride, or tungsten nitride, and/or selenium, tellurium, doped silicon, germanium, or an alloy and/or platinum, molybdenum, tungsten, tantalum, nickel, or alloy.

The material of the lower conductive thermal control layer 162L is picked so that it has a Seebeck coefficient at least 10 microvolt per Kelvin larger than the Seebeck coefficient of the upper conductive thermal control layer 166L at 300 degrees Celsius, but preferably at least 50 microvolt per Kelvin larger at 300 degrees Celsius. Alternatively, a n-type doped Silicon layer with negative Seebeck coefficient can be picked for the upper conductive thermal control layer and a p-type doped Silicon layer with positive Seebeck coefficient can be picked for the lower conductive thermal control layer. The thickness of each of the first lower conductive liner layer 162L and the first upper conductive liner layer 166L can be in a range from 3 nm to 40 nm, such as from 5 nm to 20 nm, although lesser and greater thicknesses can also be employed. The control circuitry is configured to drive a current from the lower Seebeck coefficient thermal control layer to the higher Seebeck coefficient thermal control layer when reading the state of the memory cell and in the opposite direction when modifying the state of the memory cell. The choice that $S_{LL}>S_{UL}$ is exemplary, and it is understood that the materials for layers 162L and 166L can be picked so that $S_{UL}>S_{LL}$, in which case the current directions for reading and modifying the cell would be reversed from the case when $S_{LL}>S_{UL}$.

The first selector layer 14L includes a non-Ohmic material that provides electrical connection of electrical isolation depending on the magnitude and/or the polarity of an externally applied voltage bias thereacross. In one embodiment, the first selector layer 14L includes at least one threshold switch material layer. The at least one threshold switch material layer includes any suitable threshold switch material which exhibits non-linear electrical behavior, such as an ovonic threshold switch material or a diode threshold switch material (e.g., materials for p-n semiconductor diode, p-i-n semiconductor diode, Schottky diode or metal-insulator-metal diode). As used herein, an ovonic threshold switch (OTS) is a device that does not crystallize in a low resistance state under a voltage above the threshold voltage, and reverts back to a high resistance state when not subjected to a voltage above the threshold voltage across the OTS material layer. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage.

An ovonic threshold switch material (OTS material) can be non-crystalline (for example, amorphous) in a high resistance state, and can remain non-crystalline (for example, remain amorphous) in a low resistance state during application of a voltage above its threshold voltage across the OTS material. The OTS material can revert back to the high resistance state when the high voltage above its threshold voltage is lowered below a critical holding voltage. Throughout the resistive state changes, the ovonic threshold switch material can remain non-crystalline (e.g., amorphous). In one embodiment, the ovonic threshold switch material can comprise a chalcogenide material which exhibits hysteresis in both the write and read current polarities. The chalcogenide material may be a GeTe compound or a Ge—Se compound doped with a dopant selected from As, N, and C, such as a Ge—Se—As compound semiconductor material. The ovonic threshold switch material layer can include a first ovonic threshold switch material layer 14L which contains any ovonic threshold switch material. In one embodiment, the first ovonic threshold switch material layer 14L can include, and/or can consist essentially of, a GeSeAs alloy, a GeTeAs, a GeSeTeSe alloy, a GeSe alloy, a SeAs alloy, a GeTe alloy, or a SiTe alloy.

In one embodiment, the material of the first ovonic threshold switch material layer 14L can be selected such that the resistivity of the first ovonic threshold switch material layer 14L decreases at least by two orders of magnitude (i.e., by more than a factor of 100) upon application of an external bias voltage that exceeds a critical bias voltage magnitude (also referred to as threshold voltage). In one embodiment, the composition and the thickness of the first ovonic threshold switch material layer 14L can be selected such that the critical bias voltage magnitude can be in a range from 1 V to 6 V, although lesser and greater voltages can also be employed for the critical bias voltage magnitude. The thickness of the first ovonic threshold switch material layer 14L can be, for example, in a range from 1 nm to 50 nm, such as from 5 nm to 25 nm, although lesser and greater thicknesses can also be employed.

The optional first barrier layer 17L, if present, includes a barrier material, and can be formed on top of the switch material layer 14L. Optionally, an additional barrier layer (not shown) including a barrier material can be provided between the first phase change memory layer 16L and the switch material layer 14L. In case two barrier layers are employed, the lower one is referred to as a first lower barrier layer, and the upper one is referred to as a first upper barrier layer. The barrier material is a material that can prevent diffusion of, and provide effective encapsulation of, the first phase change memory material. In one embodiment, the barrier material can include, and/or can consist essentially of, amorphous carbon or carbon nitride. The thickness of the first barrier layer 17L can be in a range from 1 nm to 70 nm, such as from 5 nm to 30 nm, although lesser and grater thicknesses can also be employed.

Figure 2A:
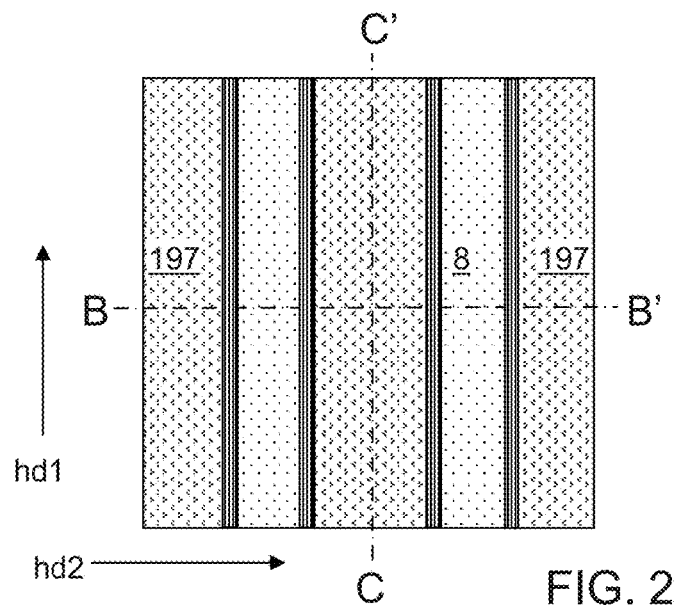
FIG. 2A is a top-down view of the exemplary structure after formation of first stacked rail structures laterally spaced by lower first-level trenches through the first layer stack according to an embodiment of the present disclosure.
Figures 2B, 2C:
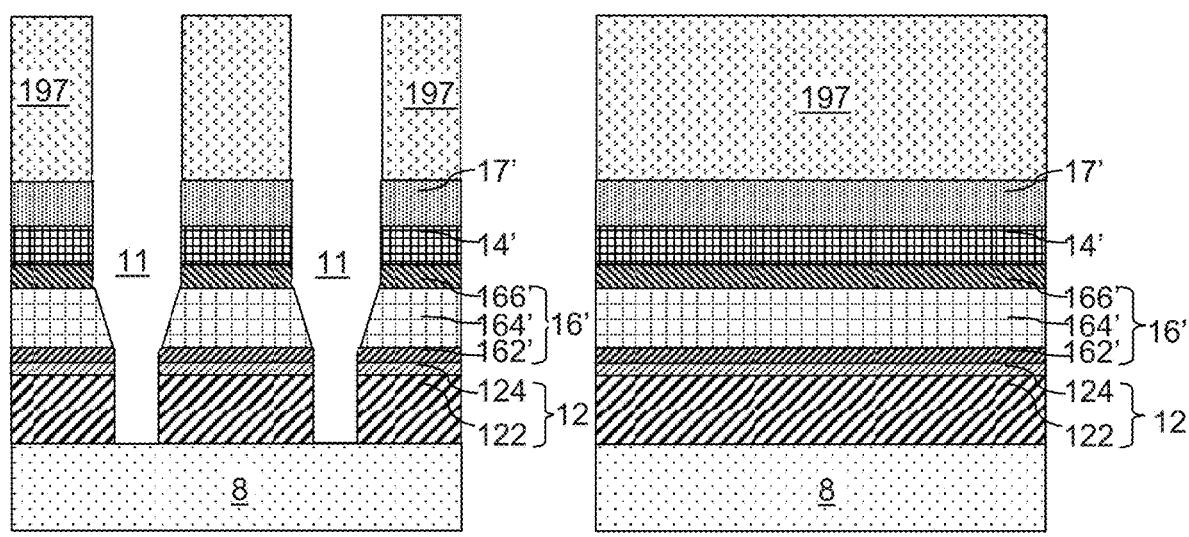
FIG. 2B is a vertical cross-sectional view of the exemplary structure along the vertical plane B-B' of FIG. 2A.
FIG. 2C is a vertical cross-sectional view of the exemplary structure along the vertical plane C-C' of FIG. 2A.

Referring to FIGS. 2A-2C, a first photoresist layer 197 can be applied over the first vertical stack (12L, 16L, 14L, 17L), and can be lithographically patterned to form a line and space pattern. For example, the first photoresist layer 197 can be patterned to form line trenches that laterally extend along the first horizontal direction hd1 and laterally spaced apart along the second horizontal direction hd2. The line trenches can have a uniform width that is invariant with translation along the first horizontal direction hd1. The pattern in the first photoresist layer 197 can be a periodic pattern that is repeated along the second horizontal direction hd2 with a pitch that is equal to the sum of the width of a line trench in the first photoresist layer 197 and the width of a patterned portion of the first photoresist layer 197. The pitch can be in a range from 32 nm to 600 nm, although lesser and greater pitches can also be employed.

An anisotropic etch process is performed employing the patterned portions of the first photoresist layer 197 as an etch mask. The anisotropic etch process etches through portions of the first vertical stack (12L, 16L, 14L, 17L) that are not masked by the first photoresist layer 197. The chemistry of the anisotropic etch process can be sequentially modified to etch through the various material layers of the first vertical stack (12L, 16L, 14L, 17L).

According to a non-limiting aspect of the present disclosure, the chemistry of the anisotropic etch process can be selected such that the first barrier layer 17L, the first selector layer 14L, and the first bottom conductive layer 12L are etched to provide sidewalls that are vertical or substantially vertical, i.e., with a taper angle less than 5 degrees from the vertical direction. Further, the chemistry of the anisotropic etch process can be selected such that first phase change memory material layer 164L is etched to provide tapered sidewalls having a taper angle in a range from 0 degree to 40 degrees (including 5 degrees to 40 degrees), such as from 15 degrees to 35 degrees and/or from 20 degrees to 30 degrees with respect to the vertical direction. The first lower conductive thermal control layer 162L and the first upper conductive thermal control layer 166L can be patterned to provide vertical or substantially vertical sidewalls.

The anisotropic etch process can stop at, or below, the top surface of the substrate 8. Lower first-level trenches 11 laterally extending along the first horizontal direction hd1 are formed by the anisotropic etch. The lower first-level trenches 11 can be line trenches having a uniform vertical cross-sectional shape within vertical planes that are perpendicular to the first horizontal direction hd1. The uniform vertical cross-sectional shape of each lower first-level trench 11 can be invariant with translation along the first horizontal direction hd1. Each lower first-level trench 11 can vertically extend from the horizontal plane including the bottom surface of the first photoresist layer 197 to the horizontal plane including the top surface of the substrate 8. Each lower first-level trench 11 can have a vertical cross-sectional shape of an inverted trapezoid.

Remaining portions of the first vertical stack (12L, 16L, 14L, 17L) include first stacked rail structures (12, 16', 14', 17'), each of which laterally extends along the first horizontal direction hd1. The first stacked rail structures (12, 16', 14', 17') are laterally spaced apart by the lower first-level trenches 11 along the second horizontal direction hd2. As used herein, a "rail" or a "rail structure" refers to a structure that extends along a lengthwise direction, and optionally with a uniform cross-sectional shape within planes that are perpendicular to the lengthwise direction that is invariant under translation along the lengthwise direction. As used herein, a "stacked rail" or a "stacked rail structure" refers to a contiguous stack of at least two rails that laterally extend along a same lengthwise direction.

Each first stacked rail structure (12, 16', 14', 17') includes, from bottom to top, a first conductive rail 12 that is a patterned portion of the first bottom conductive layer 12L, a first selector rail 14' that is a patterned portion of the first selector layer 14L, a first phase change memory rail 16' that is a patterned portion of the first phase change memory layer 16L, a first barrier rail 17' that is a patterned portion of the first barrier layer 17L. The first stacked rail structures (12, 16', 14', 17') laterally extend along the first horizontal direction hd1, are laterally spaced among one another by the lower first-level trenches 11, and are located over the substrate 8.

In one embodiment, each first phase change memory rail 16' can include, from bottom to top, a first optional lower conductive thermal control strip 162', a first phase change memory material rail 164', and a first optional upper conductive thermal control strip 166'. Each first lower conductive thermal control strip 162' is a patterned portion of the first lower conductive liner layer 162L, each first phase change memory material rail 164' is a patterned portion of the first phase change memory material layer 164L, and each first upper conductive thermal control strip 166' is a patterned portion of the first upper conductive thermal control layer 166L. In one embodiment, each of the first conductive rails 12 can include a vertical stack of a first metal rail 122 that is a patterned portion of the first metal layer 122L and a first electrode buffer strip 124 that is a patterned portion of the first electrode buffer layer 124L. As used herein, a "strip" refers to a rail having a thickness that is less than the width. The first photoresist layer 197 can be subsequently removed, for example, by ashing. The first stacked rail structures (12, 16', 14', 17') laterally extend along the first horizontal direction hd1, and are laterally spaced among one another by the lower first-level trenches 11 over the substrate 8. The first photoresist layer 197 can be subsequently removed, for example, by ashing.

Figure 3A:
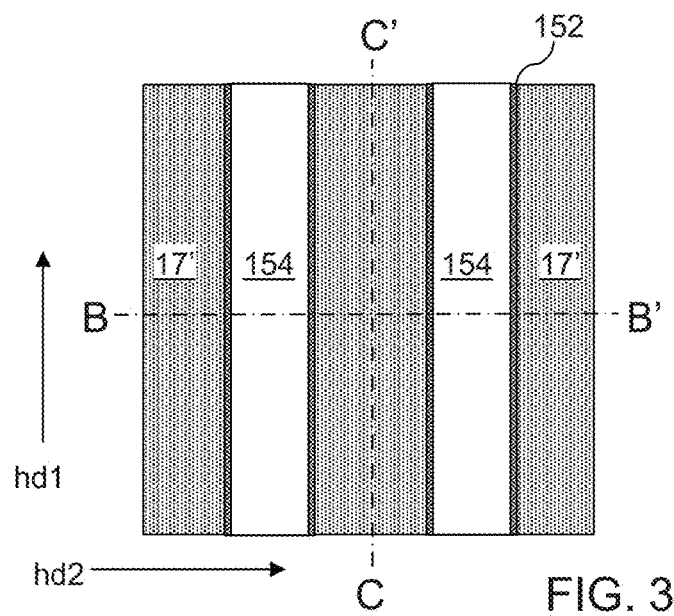
FIG. 3A is a top-down view of the exemplary structure after formation of lower first-level dielectric isolation structures according to an embodiment of the present disclosure.
Figure 3B:
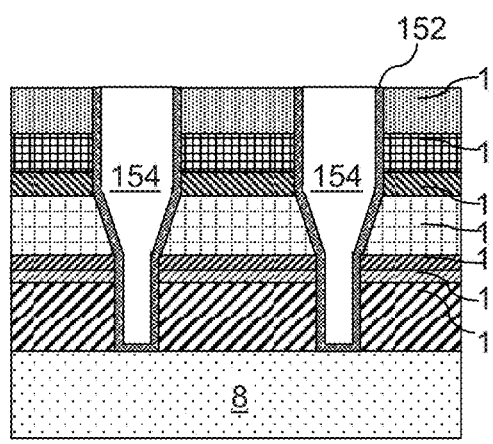
FIG. 3B is a vertical cross-sectional view of the exemplary structure along the vertical plane B-B' of FIG. 3A.
Figure 3C:
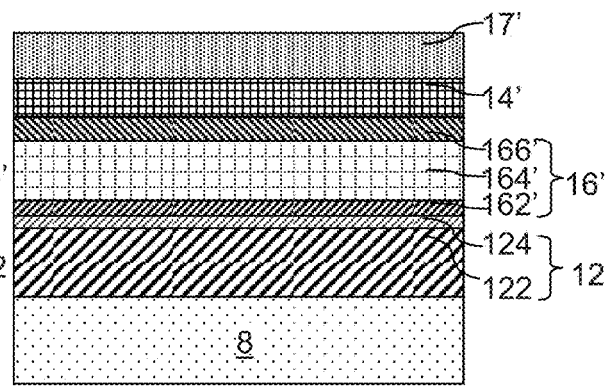
FIG. 3C is a vertical cross-sectional view of the exemplary structure along the vertical plane C-C' of FIG. 3A.

Referring to FIGS. 3A and 3B, a lower first-level continuous dielectric liner can be optionally deposited on sidewalls and bottom surfaces of the lower first-level trenches 11 and over the first barrier rails 17'. The lower first-level continuous dielectric liner includes a dielectric material such as silicon nitride, a dielectric metal oxide (such as aluminum oxide), or silicon oxide. The lower first-level continuous dielectric liner can be deposited by a conformal deposition method such as chemical vapor deposition (CVD) or atomic layer deposition (ALD). The thickness of the lower first-level continuous dielectric liner can be in a range from 1 nm to 10 nm, such as from 2 nm to 6 nm, although lesser and greater thicknesses can also be employed.

A lower first-level dielectric fill material layer can be deposited on the lower first-level continuous dielectric liner. The lower first-level dielectric fill material layer includes a planarizable dielectric material such as undoped silicate glass (e.g., silicon oxide), doped silicate glass, or a spin-on glass (SOG). The lower first-level dielectric fill material layer can be deposited by a conformal deposition method or by a self-planarizing deposition method (such as spin coating). In one embodiment, the lower first-level continuous dielectric liner can include, and/or can consist essentially of, a material selected from silicon nitride and a dielectric metal oxide, and the lower first-level dielectric fill material layer can include, and/or can consist essentially of, a material selected from doped silicate glass and undoped silicate glass.

Portions of the lower first-level continuous dielectric liner and the lower first-level dielectric fill material layer can be removed from above the horizontal plane including top surfaces of the first barrier rails 17' by a planarization process. The planarization process can include chemical mechanical planarization (CMP) and/or a recess etch process. Each remaining portion of the lower first-level continuous dielectric liner constitutes a lower first-level dielectric liner 152, and each remaining portion of the lower first-level dielectric fill material layer constitutes a lower first-level dielectric fill material portion 154. Each contiguous set of a lower first-level dielectric liner 152 and a lower first-level dielectric fill material portion 154 constitutes a lower first-level dielectric isolation structure (152, 154), which is a dielectric isolation structure having a shape of a rail. A lower first-level dielectric isolation structure (152, 154) is formed in each of the lower first-level trenches 11 as a rail structure. The lower first-level dielectric isolation structures (152, 154) laterally extend along the first horizontal direction hd1, and are laterally spaced among one another along the second horizontal direction hd2. The top surfaces of the lower first-level dielectric isolation structures (152, 154) can be coplanar with the top surfaces of the first barrier rails 17'.

Referring to FIGS. 4A-4C, a first top conductive layer 18L can be formed over the one-dimensional array of first stacked rail structures (12, 16', 14', 17') spaced by the lower first-level dielectric isolation structures (152, 154). The first top conductive layer 18L includes at least one conductive material layer, which can be at least one metallic material layer. For example, the first top conductive layer 18L can include a metal layer (such as a tungsten layer). The thickness of the first top conductive layer 18L can be in a range from 20 nm to 100 nm, such as from 30 nm to 70 nm, although lesser and greater thicknesses can also be employed. The thickness of the first top conductive layer 18L can be in a range from 1 nm to 10 nm, such as from 1.5 nm to 5 nm, although lesser and greater thicknesses can also be employed.

A second photoresist layer 199 having a line and space pattern can be formed over the first top conductive layer 18L. Portions of the second photoresist layer 199 laterally extend along the second horizontal direction hd2 with a respective uniform width. Thus, line trenches are present among the portions of the second photoresist layer 199. The line trenches laterally extend along the second horizontal direction hd2, and are laterally spaced apart along the first horizontal direction hd1. The line trenches can have a uniform width that is invariant with translation along the second horizontal direction hd2. The pattern in the second photoresist layer 199 can be a periodic pattern that is repeated along the first horizontal direction hd1 with a pitch that is equal to the sum of the width of a line trench in the second photoresist layer 199 and the width of a patterned line-shaped portion of the second photoresist layer 199. The pitch can be in a range from 32 nm to 600 nm, although lesser and greater pitches can also be employed.

Figure 5A:
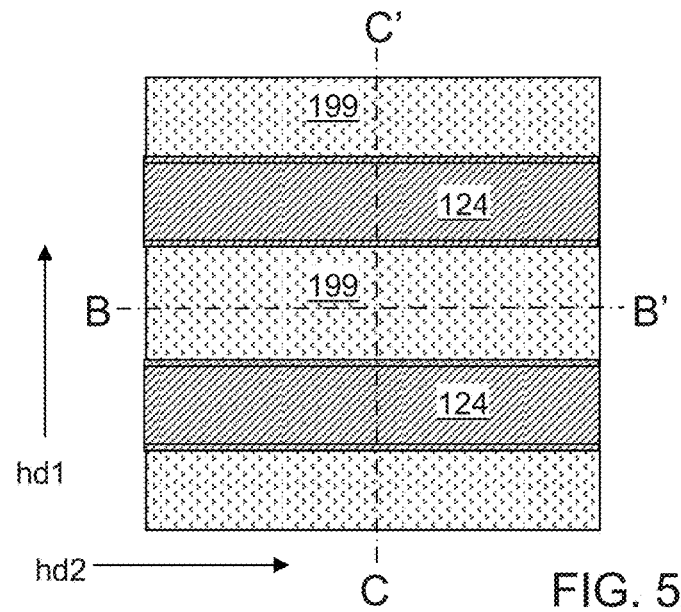
FIG. 5A is a vertical cross-sectional view of the exemplary structure after formation of upper first-level trenches through the first top conductive layer, the first stacked rail structures, and the lower first-level dielectric isolation structures and formation of second lower conductive rails according to an embodiment of the present disclosure.
Figure 5B:
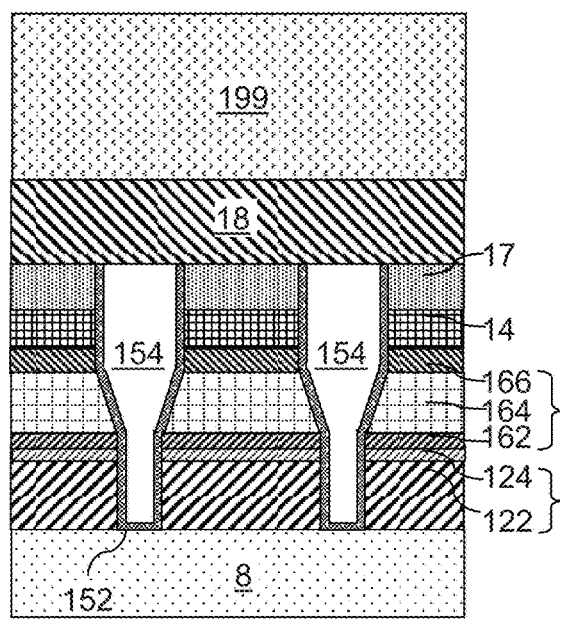
FIG. 5B is a vertical cross-sectional view of the exemplary structure along the vertical plane B-B' of FIG. 5A.
Figure 5C:
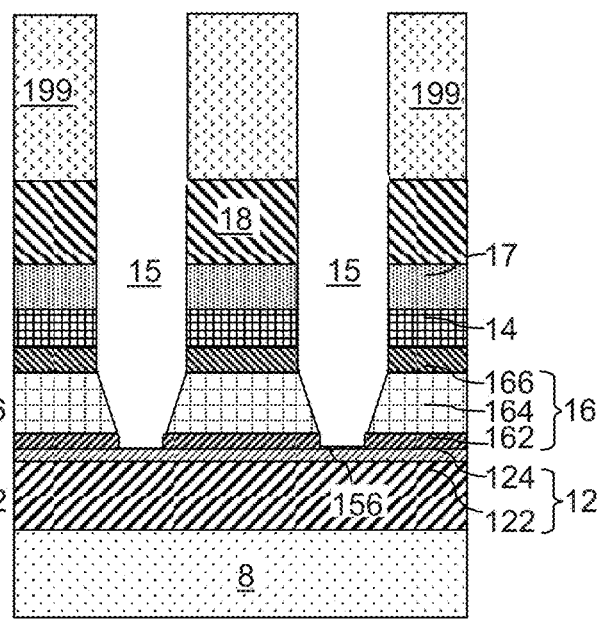
FIG. 5C is a vertical cross-sectional view of the exemplary structure along the vertical plane C-C' of FIG. 5A.
Figure 6D:
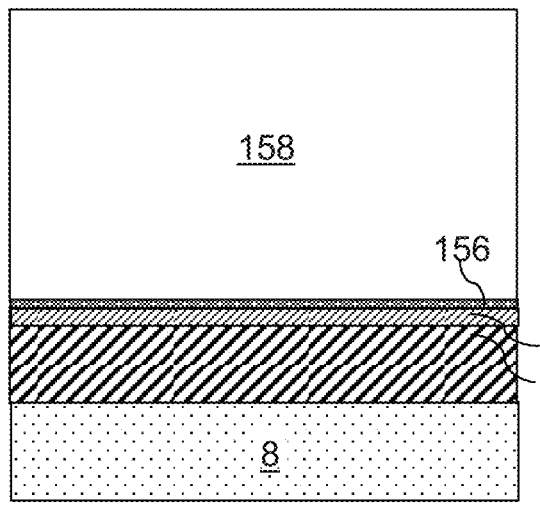
FIG. 6D is a vertical cross-sectional view of the exemplary structure along the vertical plane D-D' of FIG. 6A.
Figure 6E:
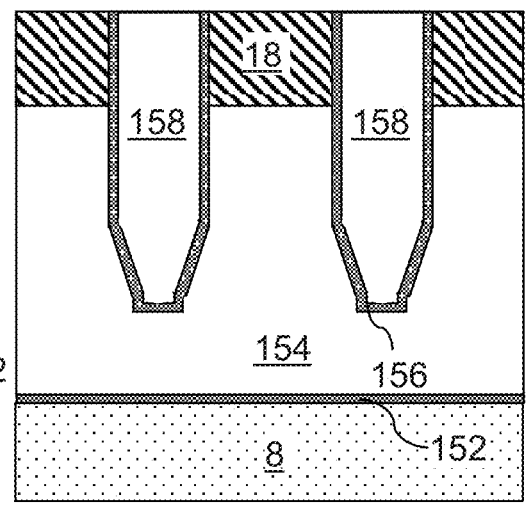
FIG. 6E is a vertical cross-sectional view of the exemplary structure along the vertical plane E-E' of FIG. 6A.
Figure 7D:
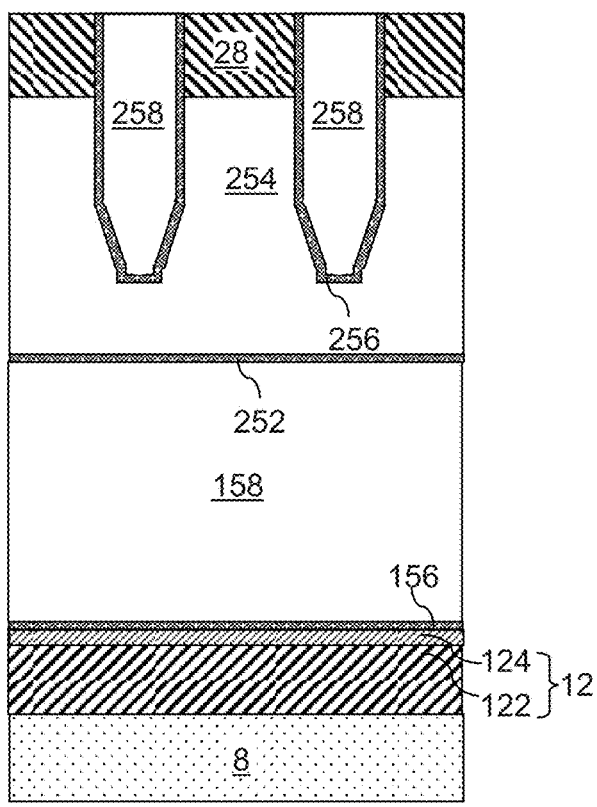
FIG. 7D is a vertical cross-sectional view of the exemplary structure along the vertical plane D-D' of FIG. 7A.
Figure 7E:
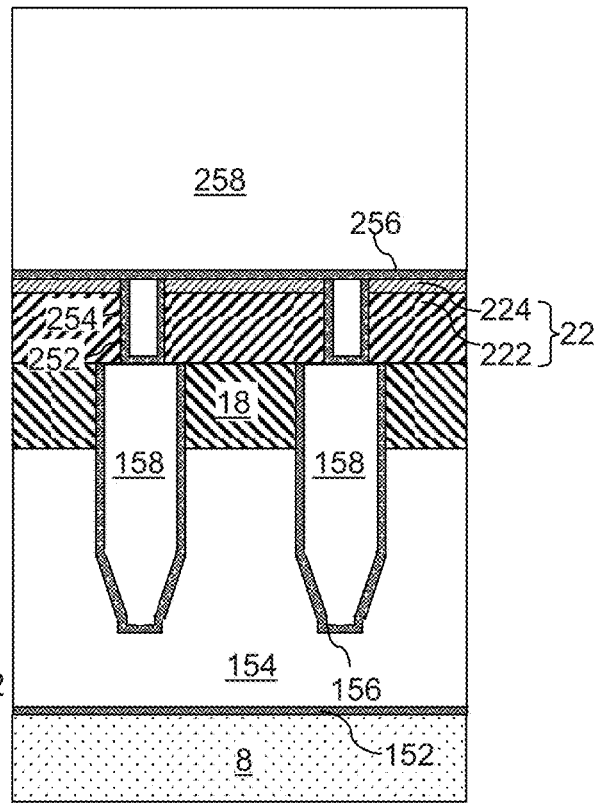
FIG. 7E is a vertical cross-sectional view of the exemplary structure along the vertical plane E-E' of FIG. 7A.

Referring to FIGS. 5A-5C, upper first-level trenches 15 are formed through the first top conductive layer 18L, the first stacked rail structures (12, 16', 14', 17'), and the lower first-level dielectric isolation structures (152, 154). An anisotropic etch process can be performed to etch portions of the first top conductive layer 18L, the first barrier rails 17', the first selector rails 14', the first phase change memory rails 16', and upper regions of the lower first-level dielectric isolation structures (152, 154) that are not masked by the second photoresist layer 199. The materials of the first top conductive layer 18L, the first barrier rails 17', the first selector rails 14', the first phase change memory rails 16', and the lower first-level dielectric isolation structures (152, 154) can be etched selective to the material in the top portions of the first conductive rails 12 by the anisotropic etch process. Volumes from which the materials of the first top conductive layer 18L, the first barrier rails 17', the first selector rails 14', the first phase change memory rails 16', and upper regions of the lower first-level dielectric isolation structures (152, 154) are removed constitute the upper first-level trenches 15. The upper first-level trenches 15 laterally extend along the second horizontal direction hd2.

The chemistry of the anisotropic etch process can be sequentially modified to etch through the various materials of the first top conductive layer 18L, the first barrier rails 17', the first selector rails 14', the first phase change memory rails 16', and the lower first-level dielectric isolation structures (152, 154). The anisotropic etch process can stop at the top surface of, or within, the first conductive rails 12. For example, the anisotropic etch process can stop on the first electrode buffer strips 124. The upper first-level trenches 15 can be line trenches having a uniform vertical cross-sectional shape within vertical planes that are perpendicular to the second horizontal direction hd2. The uniform vertical cross-sectional shape of each upper first-level trench 15 can be invariant with translation along the second horizontal direction hd2. Each upper first-level trench 15 can vertically extend from the horizontal plane including the bottom surface of the second photoresist layer 199 to the horizontal plane including top surfaces of the first conductive rails 12 (which can be word lines for example). Each upper first-level trench 15 can have a vertical cross-sectional shape of an inverted trapezoid such that each upper first-level trench 15 has a pair of tapered lengthwise sidewalls and a lesser width at a bottom portion than at a top portion.

According to an aspect of the present disclosure, the chemistry of the anisotropic etch process can be selected such that the first top conductive layer 18L, the first barrier rails 17', and the first selector rails 14' are etched to provide sidewalls that are vertical or substantially vertical, i.e., with a taper angle less than 5 degrees from the vertical direction. Further, the chemistry of the anisotropic etch process can be selected such that first phase change memory rails 16' are etched to provide tapered sidewalls having a taper angle in a range from 0 degree to 40 degrees (including 5 degrees to 40 degrees), such as from 15 degrees to 35 degrees and/or from 20 degrees to 30 degrees with respect to the vertical direction. The first optional lower conductive thermal control strips 162' and the first optional upper conductive thermal control strips 166' can be patterned to provide vertical or substantially vertical sidewalls.

The first top conductive layer 18L is divided into a one-dimensional array of conductive rails, which are herein referred to as lower second conductive rail portions 18 (which can be portions of bit lines for example). Each lower second conductive rail portion 18 is subsequently incorporated into a respective second conductive rail that includes a respective upper second conductive rail portion to be subsequently formed thereabove.

Each vertical stack of a first barrier rail 17', a first phase change memory rails 16', and a first selector rails 14' is divided into a row of first memory pillar structures (16, 14, 17) that are laterally spaced apart long the first horizontal direction hd1. The combination of the first barrier rails 17', the first phase change memory rails 16', and the first selector rails 14' is divided into a two-dimensional array of first memory pillar structures (16, 14, 17), which may be a periodic two-dimensional array. The two-dimensional array of first memory pillar structures (16, 14, 17) can form a rectangular periodic two-dimensional array having a first pitch along the first horizontal direction hd1 and a second pitch along the second horizontal direction hd2.

As used herein, a "pillar" or a "pillar structure" refers to a structure that extends along a vertical direction. Sidewalls of a pillar structure may be vertical, substantially vertical, or tapered. As used herein, a sidewall is "substantially vertical" if the sidewall is tapered, i.e., tilted, with respect to a vertical direction by a tilt angle that is less than 5 degrees.

Each first memory pillar structure (16, 14, 17) includes, from bottom to top, a first phase change memory pillar 16 that is a patterned portion of a phase change memory rail 16', a first selector pillar 14 that is a patterned portion of a first selector rail 14', and an optional first barrier plate 17 that is a patterned portion of a first barrier strip 17'. As used herein, a "plate" refers to a structure with a vertical thickness (such as a uniform vertical thickness) that is less than the maximum lateral dimension of the structure in any horizontal direction.

Each first phase change memory pillar 16 is a phase change memory element, i.e., a structure that changes the resistance depending on the phase of a material therein. In one embodiment, each first phase change memory pillar 16 can include a vertical stack of an optional first lower conductive thermal control plate 162 that is a patterned portion of a first optional lower conductive thermal control strip 162', a first phase change memory material pillar 164 that is a patterned portion of a first phase change memory material rail 164', and a first optional upper conductive thermal control plate 166 that is a patterned portion of a first upper conductive thermal control strip 166'. In one embodiment, each sidewall of the first phase change memory material pillars 164 may be tapered with a taper angle in a range from 0 degree to 40 degrees (including 5 degrees to 40 degrees), such as from 15 degrees to 35 degrees and/or from 20 degrees to 30 degrees. The horizontal cross-sectional shape of each first phase change memory material pillar 164 can strictly decrease with a vertical distance from the top surface of the substrate 8.

Each first selector pillar 14 is a selector element, i.e., an element that provides non-linear voltage-current characteristics such that the element functions as a conductor under first voltage bias conditions and as an insulator under second voltage bias conditions. In one embodiment, each first selector pillar 14 can include a first ovonic threshold switch material portion 14 that is a patterned portion of a first ovonic threshold switch material rail 14'.

Each lower first-level dielectric isolation structure (152, 154) has a laterally undulating height after the anisotropic etch process. Specifically, the height of each lower first-level dielectric isolation structure (152, 154) can be the same as the total thickness of a first stacked rail structure (12, 16', 14', 17') as provided at the processing steps of FIGS. 4A-4C underneath each portion of the second photoresist layer 199, and can be about the same as the height (i.e., the thickness) of a first conductive rail 12 underneath each upper first-level trench 15. Each lower first-level dielectric isolation structure (152, 154) can continuously extend underneath a plurality of upper first-level trenches 15.

The first barrier plates 17 are barrier elements, and can be arranged in a two-dimensional periodic array. While FIGS. 5A-5C illustrate an embodiment in which a first phase change memory pillar 16 underlies a first selector pillar 14 within each first memory pillar structure (16, 14, 17), embodiments are expressly contemplated herein in which a first phase change memory pillar 16 overlies a first selector pillar 14 within each first memory pillar structure (16, 14, 17). In each case, if a first barrier plate 17 is present within a first memory pillar structure (16, 14, 17), a two-dimensional array of barrier elements (i.e., first barrier plates 17) may be disposed between the first phase change memory elements (i.e., the first phase change memory pillars 16) and a proximal set among a set of the first conductive rails 12 and a set of the lower second conductive rail portions 18.

Referring to FIGS. 6A-6E, the second photoresist layer 199 can be subsequently removed, for example, by ashing. An upper first-level continuous dielectric liner can be optionally deposited on sidewalls and bottom surfaces of the upper first-level trenches 15 and over the lower second conductive rail portions 18. The upper first-level continuous dielectric liner includes a dielectric material such as silicon nitride, a dielectric metal oxide (such as aluminum oxide), or silicon oxide. The upper first-level continuous dielectric liner can be deposited by a conformal deposition method such as chemical vapor deposition (CVD) or atomic layer deposition (ALD). The thickness of the upper first-level continuous dielectric liner can be in a range from 1 nm to 10 nm, such as from 2 nm to 6 nm, although lesser and greater thicknesses can also be employed.

An upper first-level dielectric fill material layer can be deposited on the upper first-level continuous dielectric liner. The upper first-level dielectric fill material layer includes a planarizable dielectric material such as undoped silicate glass (e.g., silicon oxide), doped silicate glass, or a spin-on glass (SOG). The upper first-level dielectric fill material layer can be deposited by a conformal deposition method or by a self-planarizing deposition method (such as spin coating). In one embodiment, the upper first-level continuous dielectric liner can include, and/or can consist essentially of, a material selected from silicon nitride and a dielectric metal oxide, and the upper first-level dielectric fill material layer can include, and/or can consist essentially of, a material selected from doped silicate glass and undoped silicate glass.

Portions of the upper first-level continuous dielectric liner and the upper first-level dielectric fill material layer can be removed from above the horizontal plane including top surfaces of the lower second conductive rail portions 18 by a planarization process. The planarization process can include chemical mechanical planarization (CMP) and/or a recess etch process. Each remaining portion of the upper first-level continuous dielectric liner constitutes an upper first-level dielectric liner 156, and each remaining portion of the upper first-level dielectric fill material layer constitutes an upper first-level dielectric fill material portion 158. Each contiguous set of an upper first-level dielectric liner 156 and an upper first-level dielectric fill material portion 158 constitutes an upper first-level dielectric isolation structure (156, 158), which is a dielectric isolation structure having a shape of a rail. The upper first-level dielectric isolation structure (156, 158) is formed in each of the upper first-level trenches 15 as a rail structure. The upper first-level dielectric isolation structures (156, 158) laterally extend along the second horizontal direction hd2, and are laterally spaced among one another along the first horizontal direction hd1. The top surfaces of the upper first-level dielectric isolation structures (156, 158) can be coplanar with the top surfaces of the lower second conductive rail portions 18.

The set of all structures above the horizontal plane including the top surface of the substrate 8 constitutes a first-level structure that includes a first two-dimensional array of first memory pillar structures (16, 14, 17).

Referring to FIGS. 7A-7E, the processing steps of FIGS. 1A and 1B, 2A-2C, 3A-3C, 4A-4C, 5A-5C, and 6A-6E are repeated on top of the first-level structure to form a second-level structure including a second two-dimensional array of second memory pillar structures. The patterns of various structures in the second-level structure can be rotated relative to the corresponding structures in the first-level structure by 90 degrees. The second-level structure can include upper second conductive rail portions 22 that are second-level equivalents of the first conductive rails 12, lower second-level dielectric isolation structure (252, 254) that are second-level equivalents of the lower first-level dielectric isolation structures (152, 154), upper second-level dielectric isolation structures (256, 258) that are second-level equivalents of the upper first-level dielectric isolation structures (156, 158), second memory pillar structures (26, 24, 27) that are second-level equivalents of the first memory pillar structures (16, 14, 17), and lower third conductive rail portions 28 that are second-level equivalents of the lower second conductive rail portions 18.

Each upper second conductive rail portion 22 can be formed directly on a top surface of a respective one of the lower second conductive rail portion 18. Each vertically adjoined pair of a lower second conductive rail portion 18 and an upper second conductive rail portion 22 constitutes a second conductive rail (18, 22). Each upper second conductive rail portion 22 can include a vertical stack of a second metal rail 222 and a second electrode buffer strip 224. Each lower second-level dielectric isolation structure (252, 254) can include a contiguous set of a lower second-level dielectric liner 252 and a lower second-level dielectric fill material portion 254. Each upper second-level dielectric isolation structures (256, 258) can include a contiguous set of an upper second-level dielectric liner 256 and an upper second-level dielectric fill material portion 258. Each second memory pillar structures (26, 24, 27) can include a second phase change memory element 26, a second selector element 24, and an optional second barrier plate 27.

Figure 8A:
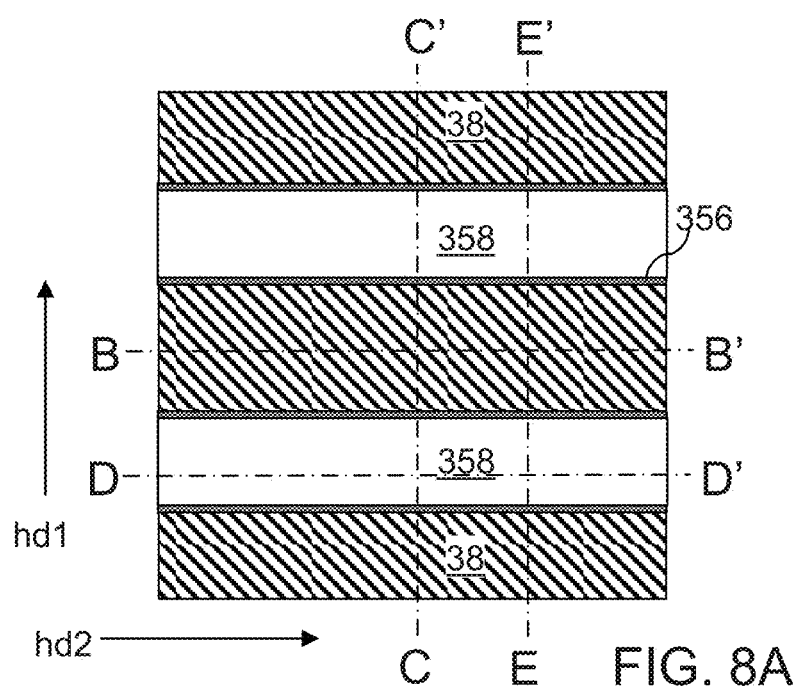
FIG. 8A is a top-down view of the exemplary structure after formation of a third-level structure according to an embodiment of the present disclosure.
Figure 8B:
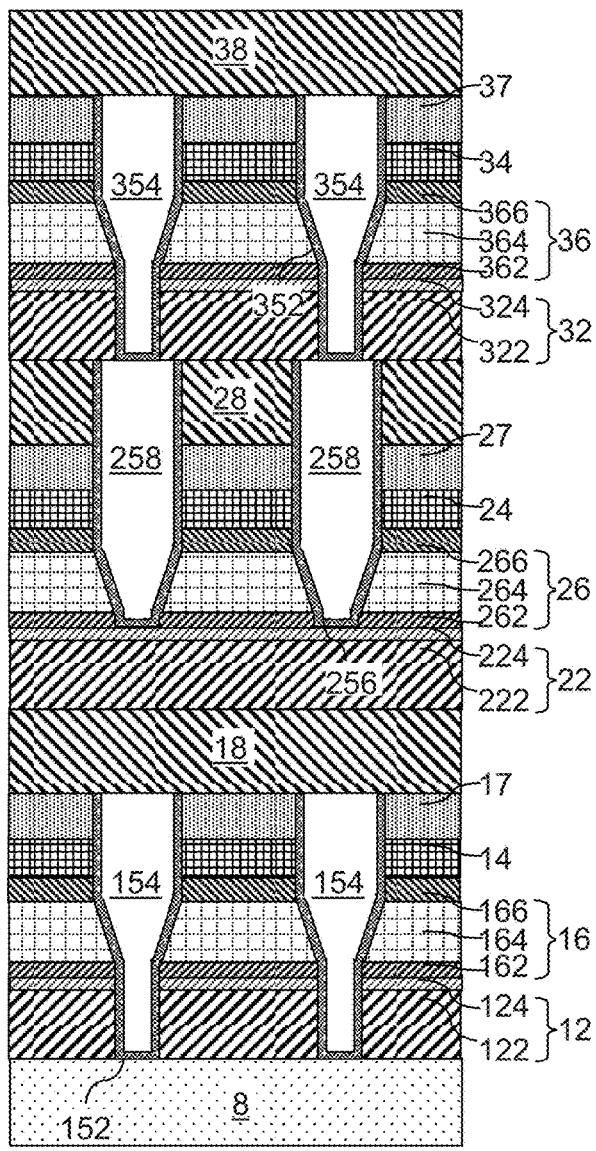
FIG. 8B is a vertical cross-sectional view of the exemplary structure along the vertical plane B-B' of FIG. 8A.
Figure 8C:
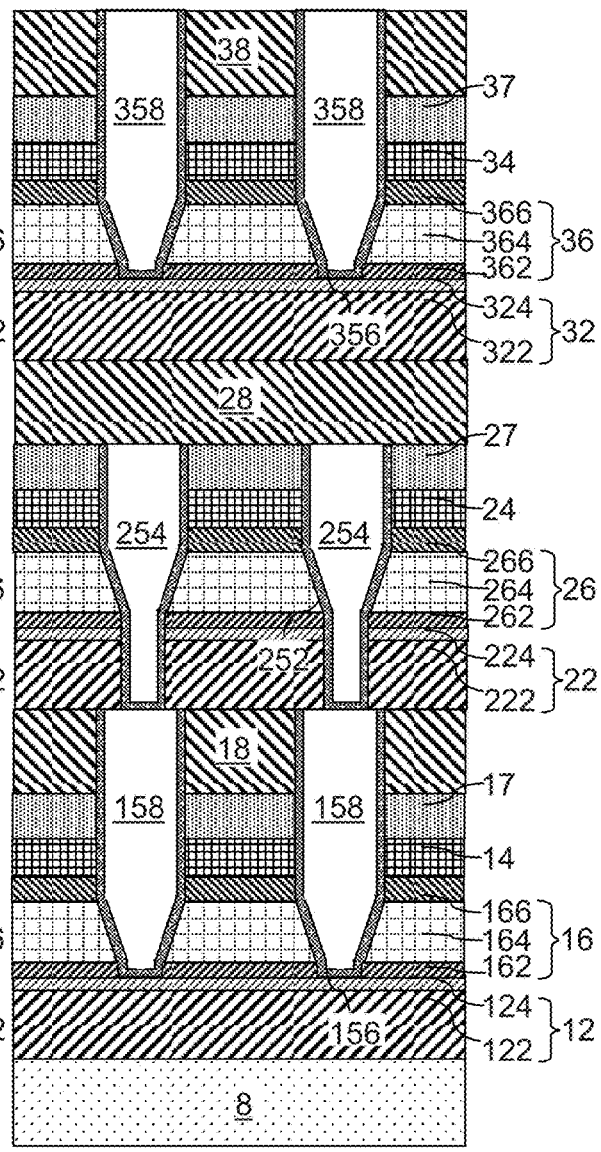
FIG. 8C is a vertical cross-sectional view of the exemplary structure along the vertical plane C-C' of FIG. 8A.

Referring to FIGS. 8A-8C, the processing steps of FIGS. 1A and 1B, 2A-2C, 3A-3C, 4A-4C, 5A-5C, and 6A-6E are repeated on top of the second-level structure to form a third-level structure including a third two-dimensional array of second memory pillar structures. The patterns of various structures in the third-level structure can be rotated relative to the corresponding structures in the second-level structure by 90 degrees, and can overlap within the pattern of the corresponding structures in the first-level structures. The third-level structure can include upper third conductive rail portions 32 that are third-level equivalents of the first conductive rails 12, lower third-level dielectric isolation structure (352, 354) that are third-level equivalents of the lower first-level dielectric isolation structures (152, 154), upper third-level dielectric isolation structures (356, 358) that are third-level equivalents of the upper first-level dielectric isolation structures (156, 158), third memory pillar structures (36, 34, 37) that are third-level equivalents of the first memory pillar structures (16, 14, 17), and lower fourth conductive rail portions 38 that are third-level equivalents of the lower second conductive rail portions 18.

Each upper third conductive rail portion 32 can be formed directly on a top surface of a respective one of the lower third conductive rail portion 28. Each vertically adjoined pair of a lower third conductive rail portion 28 and an upper third conductive rail portion 32 constitutes a third conductive rail (28, 32). Each upper third conductive rail portion 32 can include a vertical stack of a third metal rail 322 and a third electrode buffer strip 334. Each lower third-level dielectric isolation structure (352, 354) can include a contiguous set of a lower third-level dielectric liner 352 and a lower third-level dielectric fill material portion 354. Each upper third-level dielectric isolation structures (356, 358) can include a contiguous set of an upper third-level dielectric liner 356 and an upper third-level dielectric fill material portion 358. Each third memory pillar structures (36, 34, 37) can include a third phase change memory element 36, a third selector element 34, and an optional third barrier plate 37.

Additional higher-level structures can be formed to provide additional two-dimensional arrays of memory pillar structures above the third array of third memory pillar structures (36, 34, 37). The patterns of the additional higher-level structures can be selected that elements within odd-numbered levels are patterned with the same pattern as the corresponding elements within the first-level structure, and elements within even-numbered levels are patterned with the same pattern as the corresponding elements within the second-level structure.

Each level can include a respective two-dimensional array of memory pillar structures such as the first memory pillar structures (16, 14, 17). In one embodiment, the selector pillar, such as the first selector pillar within the first memory pillar structure (16, 14, 17), can be omitted from each memory pillar structure (16, 14, 17). In this case, the barrier plates (such as the optional first barrier plates 17) may be omitted from each memory pillar structure as illustrated in FIGS. 9A and 9B.

While the present disclosure is described employing an embodiment in which the first selector pillar 14 is formed above the first phase change memory pillar 16, embodiments are expressly contemplated herein in which the first selector pillar 14 is formed below the first phase change memory pillar 16. Further, while the present disclosure is described employing an embodiment in which the first barrier plates 17 are formed above the first selector pillars 14 and the first phase change memory pillars 16, embodiments are expressly contemplated herein in which the first barrier plates 17 are formed below the first selector pillars 14 and the first phase change memory pillars 16.

Figure 9A:
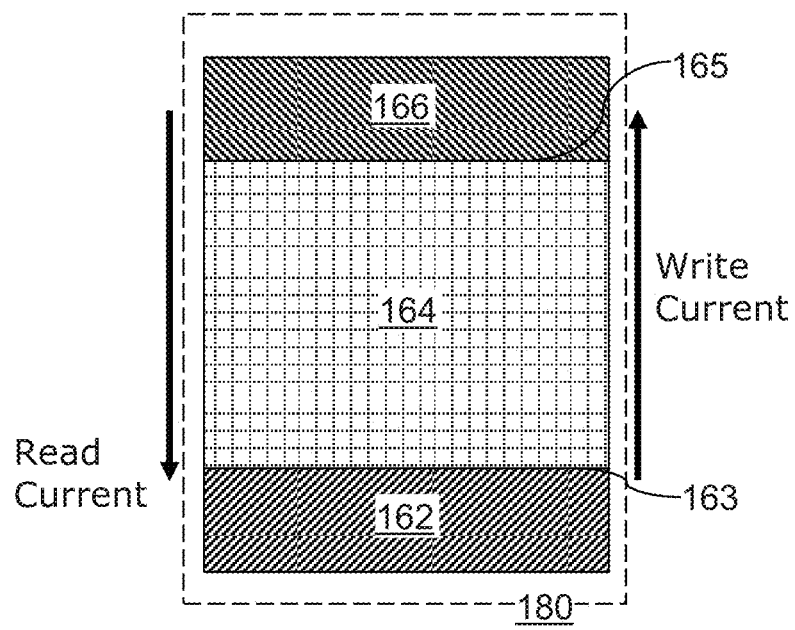
FIG. 9A is a vertical cross-sectional view of a first exemplary phase change memory cell according to an embodiment of the present disclosure.

FIG. 9A illustrates a first exemplary configuration for a resistive memory cell 180, which is a phase change memory cell. Each resistive memory cell 180 can be implemented as a first phase change memory pillar 16 within the exemplary structure of FIGS. 8A-8C, a second phase change memory pillar 26 within the exemplary structure of FIGS. 8A-8C, a third phase change memory pillar 36 within the exemplary structure of FIGS. 8A-8C, and so forth. The sidewalls of components of the first phase change memory pillar 16 can be vertically coincident (i.e., located within common vertical planes), and the horizontal cross-sectional area of the first phase change memory pillar 16 can be invariant with translation along the vertical direction (i.e., the first phase change memory pillar 16 can have a taper angle of zero).

Figure 9B:
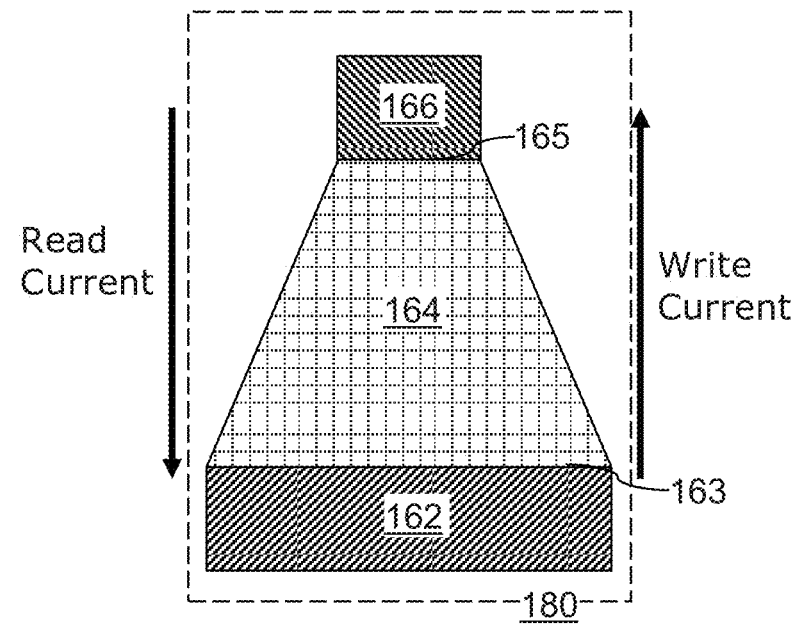
FIG. 9B is a vertical cross-sectional view of a second exemplary phase change memory cell according to an embodiment of the present disclosure.

FIG. 9B illustrates a second exemplary configuration for a resistive memory cell 180, which is a phase change memory cell. Each resistive memory cell 180 can be implemented as a first phase change memory pillar 16 within the exemplary structure of FIGS. 8A-8C, a second phase change memory pillar 26 within the exemplary structure of FIGS. 8A-8C, a third phase change memory pillar 36 within the exemplary structure of FIGS. 8A-8C, and so forth. The sidewalls of the first phase change memory pillar 16 can be tapered with a taper angle in a range from 0 degree to 40 degrees (including 5 degrees to 40 degrees), such as from 15 degrees to 35 degrees and/or from 20 degrees to 30 degrees. Each sidewall of the first phase change memory pillar 16 can be tapered with a respective taper angle. The taper angles can be formed by modifying process parameters of the anisotropic etch process that patterns the first phase change memory material, for example, by introducing an isotropic etch component and/or performing the etch process in a depletive process region in which the etchant supply is limited. In this case, the horizontal cross-sectional area of the first phase change memory pillar 16 decreases with a vertical distance from the substrate 8. The first lower conductive thermal control plate 162 can have a greater area than that of the first upper conductive thermal control plate 166 (or greater area than that of the barrier plate 17 if plate 166 is omitted).

Figure 9C:
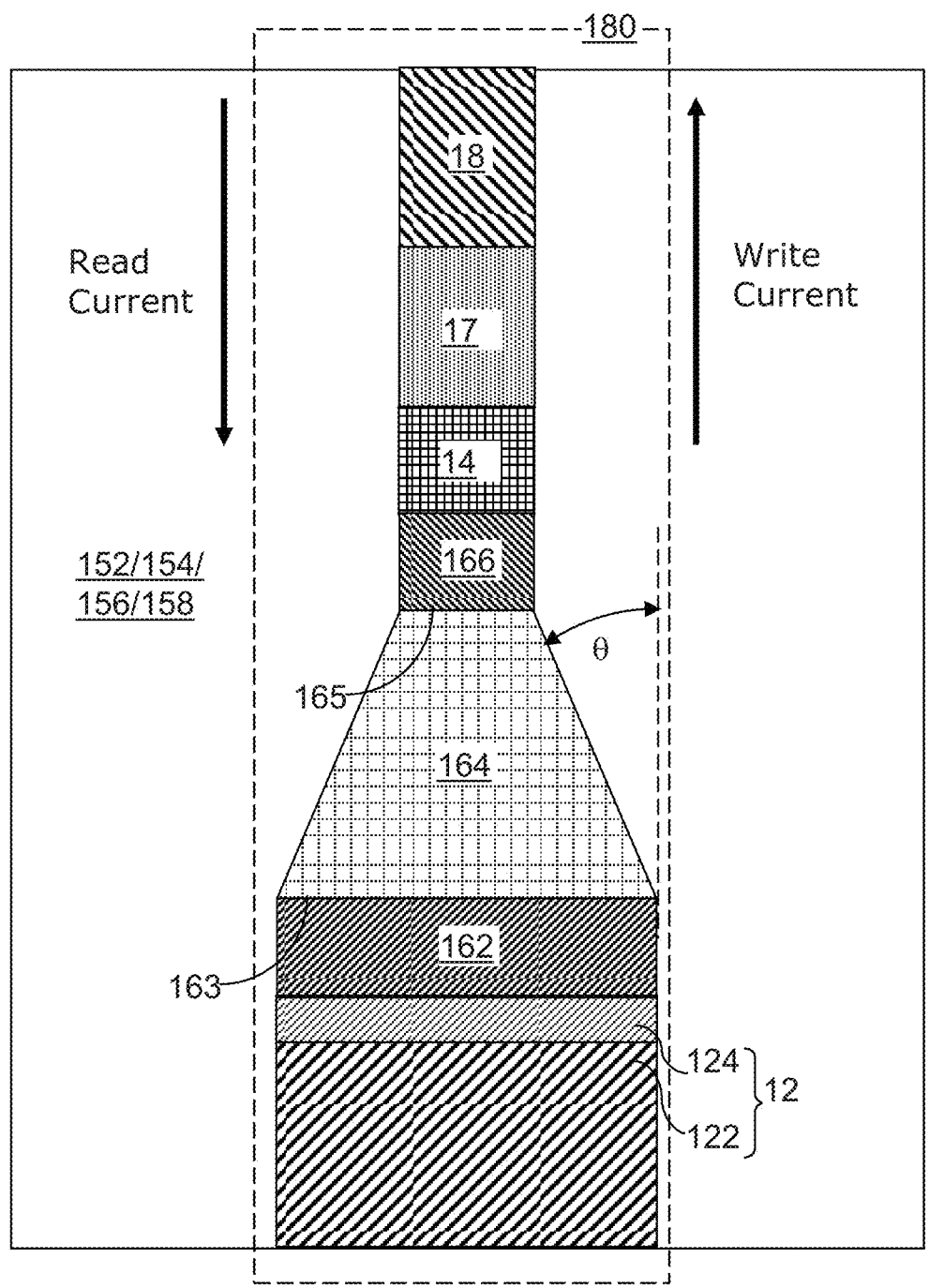
FIG. 9C is a vertical cross-sectional view of a third exemplary phase change memory cell according to an embodiment of the present disclosure.

FIG. 9C illustrates a third exemplary configuration for a resistive memory cell 180, which is a phase change memory cell. In the case of the third exemplary configuration, each resistive memory cell 180 includes a portion of a first conductive rail 12, first memory pillar structures (16, 14, 17), and lower second conductive rail portions 18. The resistive memory cell 180 can be implemented as each instance of the combination of the first selector pillar 14, the first phase change memory pillar 16 and the first barrier plate 17 within the exemplary structure of FIGS. 8A-8C, each instance of the combination of the second selector pillar 24, the second phase change memory pillar 26 and the second barrier plate 27 within the exemplary structure of FIGS. 8A-8C, each instance of the combination of the third first selector pillar 34, the third phase change memory pillar 36 and the third barrier plate 37 within the exemplary structure of FIGS. 8A-8C, and so forth. The sidewalls of the first phase change memory pillar 16 can be tapered with a taper angle θ in a range from 0 degree to 40 degrees (including 5 degrees to 40 degrees), such as from 15 degrees to 35 degrees and/or from 20 degrees to 30 degrees. Each sidewall of the first phase change memory material pillar 164 can be tapered with a respective taper angle. The taper angles θ can be formed by modifying process parameters of the anisotropic etch process that patterns the first phase change memory material, for example, by introducing an isotropic etch component and/or performing the etch process in a depletive process region in which the etchant supply is limited. In this case, the horizontal cross-sectional area of the first phase change memory material pillar 164 decreases with a vertical distance from the substrate 8. The first lower conductive thermal control plate 162 can have a greater area than that of the first upper conductive thermal control plate 166 (or greater area than that of the barrier plate 17 if plate 166 is omitted).

Each of the resistive memory cells 180 illustrated in FIGS. 9A-9C is a phase change memory cell. The phase change memory cell comprises a phase change memory element (e.g., a first phase change memory material pillar 164) located between a first electrode (e.g., a first lower conductive thermal control plate 162) and a second electrode (e.g., a first upper conductive thermal control plate 166).

According to an aspect of the present disclosure, each thermal control plate 162 can also function as an electrode for flowing electrical current, and as such, is also referred to as a first electrode 162. Depending on the configuration, each first barrier plate 17 or each first upper conductive thermal control plate 166 can function as another electrode for flowing electrical current, and as such, is herein referred to as a second electrode (17 or 166). A first junction 163 between the phase change memory element 164 and the first electrode 162 and a second junction 165 between the phase change memory element 164 and the second electrode (17 or 166) have asymmetric thermoelectric heat generation upon passing electrical current through the phase change memory element 164. In one embodiment, the asymmetric thermoelectric heat generation can be due to a difference in Seebeck coefficient between the materials of the first electrode 162 and second electrode (166, 17), a difference in current density between the first junction 163 and the second junction 165 (e.g., narrower width of the phase change memory element 164 at the second junction 165 than at the first junction 163), and/or a difference in effective thermal resistance to effective heatsinks at the first junction 163 and at the second junction 165, i.e., differences in the thermal conductance between the first junction 163 and the second junction 165.

According to another aspect of the present disclosure, the asymmetric thermoelectric heating between the first junction 163 and the second junction 165 is employed to alter current-voltage characteristics of the phase change memory cell during a write operation and a read operation. The write current can have a different polarity from the read current. For example, the write current can flow from the first electrode 162 to the second electrode (17 or 166), and the read current can flow from the second electrode (17 or 166) to the first electrode 162. Generally, if two materials A and B with Seebeck coefficients $S_A$ and $S_B$ with $S_A > S_B$ are brought into contact, an electrical current will induce thermoelectric heating of the interface AB if electrical current flows from A (higher Seebeck coefficient) material to B (lower Seebeck coefficient). The heat flow to the interface will be equal to $(S_A - S_B) T_{AB}$ I, where $T_{AB}$ is the interface temperature and I is the net current through the junction. If the electrical current is reversed, the interface AB will experience thermoelectric cooling with heat removed at rate $-(S_A - S_B) T_{AB}$ I. If a third material C is placed into between materials A & B, the net heat generated at the two interfaces AC and BC follows the equations above. If material C is at uniform temperature the net thermoelectric heat delivered to material C is equal to the thermoelectric delivered to interface AB previously.

Generally, thermal asymmetry in phase change memory cells of the embodiment of present disclosure can enhance the write current polarity asymmetry when combined with thermoelectric effects caused by the asymmetric thermoelectric heating between the first junction 163 and the second junction 165. In addition, shape asymmetry in phase change memory cells, and particularly shape asymmetry in first phase change memory material pillars 164 having tapered sidewalls, can produce write current polarity asymmetry when combined with thermoelectric effects, even if the net thermoelectric heating generation between the first junction 163 and the second junction 165 is symmetric. The asymmetry in current polarity can arise because the narrower junction will dominate write characteristics since it has higher current density, and hence higher heat generation density, leading to higher temperature. Asymmetry in thermoelectric heat generation between the first junction 163 and the second junction 165 will further enhance the effect.

According to one embodiment of the present disclosure, the resistive memory cells 180 of the present provide asymmetric heat sinking. Asymmetric heatsinking can cause one junction of the phase change memory material 164 to have higher temperature (the low heat sunk side) and the other junction to have a lower temperature (the high heat sunk side). The low heat sunk side will dominate the write characteristics of the cell. The write current polarity is selected such that thermoelectrically driven heat generation is smaller at the high heat sunk side (such as the first electrode 162 having a lower thermal resistance to the conductive rails 8 that serve as thermal heat sinks) and higher at the lower heat sink (such as the second electrode (166, 17) having a higher thermal resistance to conductive rails 18 that serve as thermal heat sinks). The read current polarity is selected to be in the opposite direction.

In some other embodiments, such as the configurations of FIGS. 9B and 9C in which the first phase change memory material pillars 164 have tapered sidewalls, the write current polarity can be selected such that the thermoelectrically driven heat generation density is greater at the narrower second interface 165 having a narrower horizontal cross-sectional shape than the wider first interface 163 having a greater horizontal cross-sectional shape. In contrast, the read current flows in the opposite direction. In this embodiment, the first electrode 162 and the second electrode (166, 17) can be made of the same material or different materials. The Seebeck coefficients of the first electrode 162, second electrode 166, and phase change memory 164, are $S_{LL}$, $S_{UL}$, and $S_{PCM}$, respectively. In the embodiment the materials are picked such that $S_{PCM} > S_{UL}$. $S_{LL}$ can be approximately equal or larger than $S_{UL}$, but preferably $S_{LL} > S_{PCM}$.

In both embodiments, the read current polarity is the opposite of the write polarity. Generally, the Seebeck coefficient of the phase change memory material (such as GST) of the first phase change memory material pillars 164 is more positive than that of the electrode materials (162, (166, 17)). Generally, thermoelectric effects cause the amount of electrical current required to change the state of a phase change memory material to depend on the polarity of the electrical current. In other words, the asymmetric thermoelectric heat generation between the first junction 163 and the second junction 165 causes the programming voltage for the phase change memory material to be higher during programming under a first polarity (which is herein referred to as a positive polarity), and to be lower during programming under a second polarity (which is herein referred to as a negative polarity). Thus, thermoelectric effects reduce the magnitude of the required write current for one current polarity (i.e., the negative polarity) and increase the magnitude of the required write current by a comparable amount for the other polarity (i.e., the positive polarity).

According to an aspect of the present disclosure, the resistive memory cells 180 of the present disclosure employ different current polarities for reading and writing. Writing is performed in the second, negative polarity, i.e., along a direction that decreases the required write current for changing the state of the phase change memory material. The mode for providing an electrical bias of the second polarity (negative polarity) is herein referred to as a reverse bias mode, in which a voltage applied to the first electrode 162 is more positive than the voltage applied to the second electrode 166.

Reading is performed in the first, positive polarity, i.e., along a direction that increases the required write current if a change of the state of the phase change memory material were to be desired. Thus, the thermoelectric effects make it harder to change the state of the memory cell during reading and thus reduce the read disturb of the memory cells. The magnitude of the bias voltages for reading is selected such that the read current is small enough to avoid any change of state of the phase change memory material. The mode for providing an electrical bias of the first polarity (positive polarity) is herein referred to as a forward bias mode, in which a voltage applied to the first electrode 162 is more negative than the voltage applied to the second electrode 166.

The phase change memory cells of the present disclosure reduce the probability of modification to the resistive state of the first phase change memory material pillars 164. The bit error rate (BER) can be reduced, and the need for data refresh can also be reduced. Further, the impact of overshoot or snapback during resistive state changes can be reduced, and the need for compensation can be eliminated or reduced. The read current can be greater than prior art phase change memory cells that do not provide an increase in the minimum required programming current during the read operation. As used herein, a "minimum required programming current" refers to the magnitude of the minimum electrical current that needs to flow through a memory element in order to successfully program the memory element. The increase in the read current can be employed to increase read accuracy and/or to improve read latency. The greater the reduction to the minimum required programming current during the write operation, the greater the reduction in the power consumption that occurs during the write operation. Generally, the phase change memory minimum required programming current is reduced in the negative polarity (second polarity) under the reverse bias conditions, and is increased in the positive polarity (first polarity) under the positive bias conditions.

Figure 10:
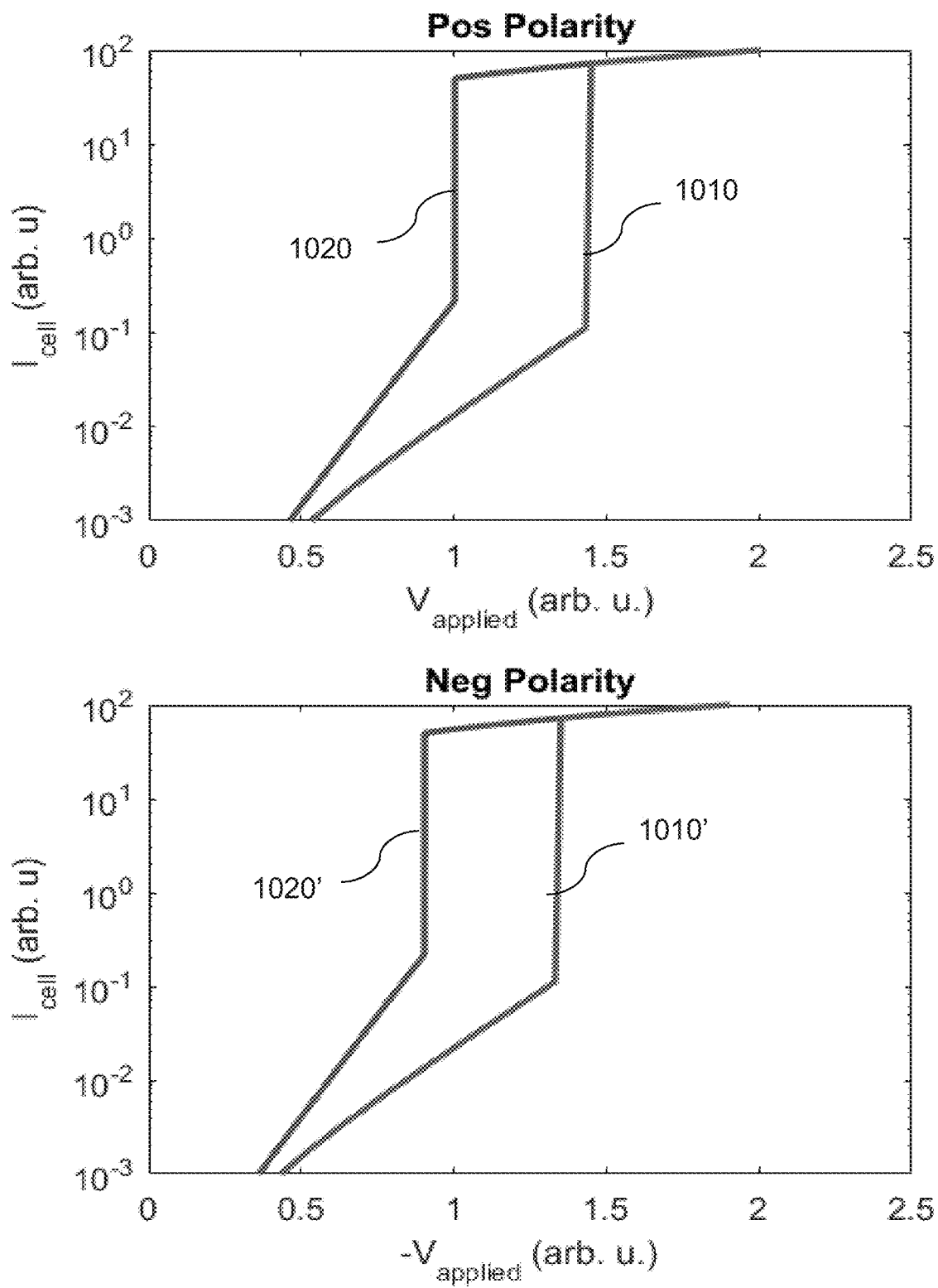
FIG. 10 illustrates exemplary current-voltage characteristics of an exemplary phase change memory cell of FIG. 9C according to an embodiment of the present disclosure.
Figure 11:
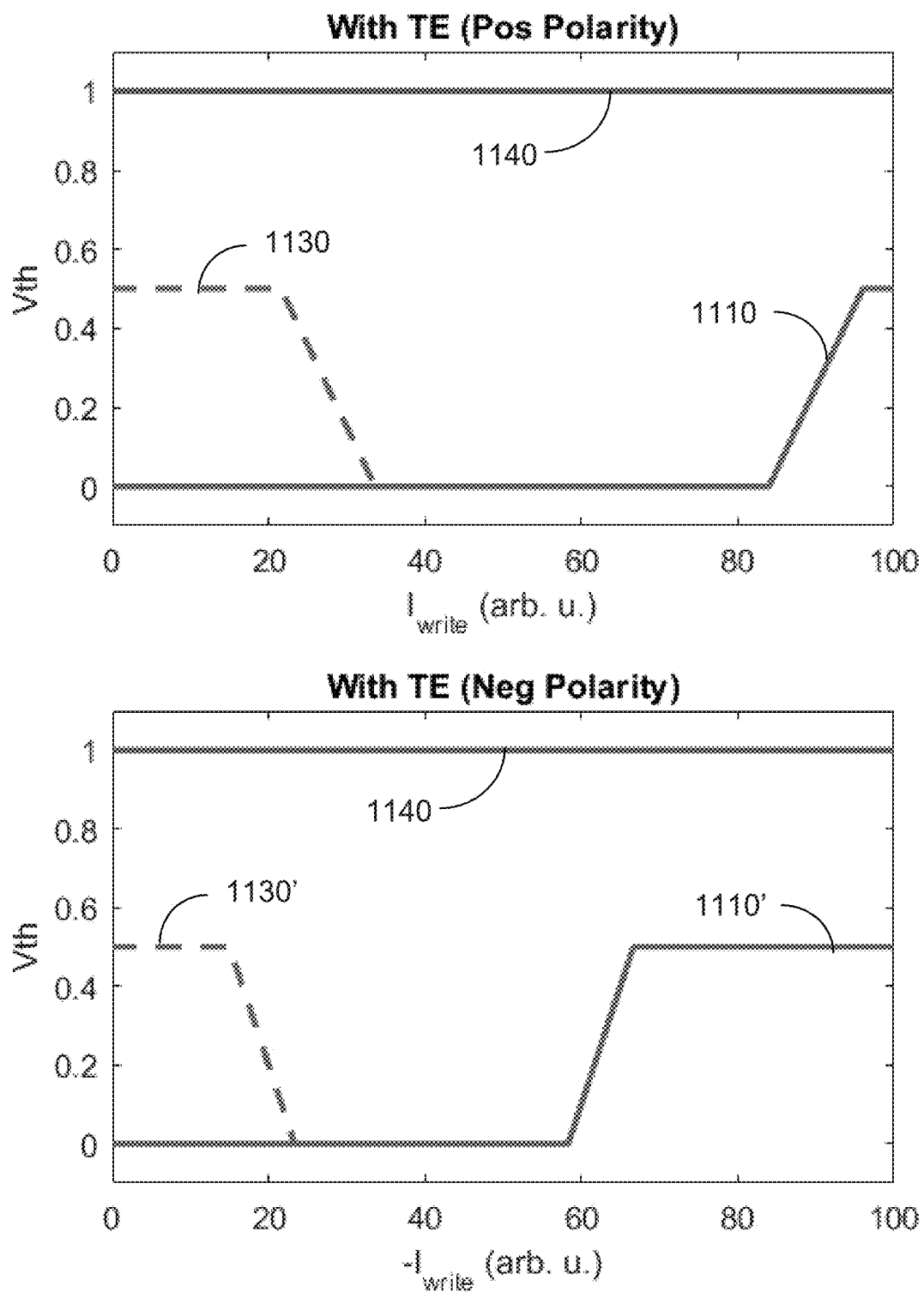
FIG. 11 illustrates exemplary current-voltage characteristics of components of the exemplary phase change memory cell of FIG. 9C according to an embodiment of the present disclosure.

FIG. 10 illustrates current-voltage characteristics of an exemplary phase change memory cell of FIG. 9C. FIG. 11 illustrates current-voltage characteristics of components of the phase change memory cell of FIG. 9C. Generally, the set operation voltage for a first phase change memory material pillar 164 (or any other phase change memory material pillar), the reset operation voltage for the first phase change memory material pillar 164, and the threshold voltage for turning on a first selector pillar 14 (or any other selector pillar) are different among one another. While the magnitude of the threshold voltages for initial turn-on of the various components of the phase change memory cell is generally unaffected by the polarity of applied electrical bias voltage, the magnitude of the electrical current required to perform a reset operation depends on the polarity of the applied electrical bias voltage.

For example, the current-voltage curve for a phase change memory reset operation in the positive polarity (i.e., in the forward bias mode) is shown by a forward bias reset operation current-voltage curve 1010, and the current-voltage curve for a phase change memory set operation in the positive polarity is shown by a forward bias set operation current-voltage curve 1020. The current-voltage curve for the phase change memory reset operation in the negative polarity (i.e., in the reverse bias mode) is shown by a reverse bias reset operation current-voltage curve 1010', and the current-voltage curve for a phase change memory set operation in the negative polarity is shown by a reverse bias set operation current-voltage curve 1020'. By performing a write operation in the reverse bias mode, the programming voltage and the power consumption can be lowered for the phase change memory cells of the present disclosure.

Referring to FIG. 11, the forward bias read operation current-voltage curve 1130 allows higher electrical current than the reverse bias read operation current-voltage curve 1130'. The selector threshold voltage 1140 can be substantially invariant with respect to the polarity of electrical bias conditions. In the illustrated example of FIG. 11, a read operation can be performed with positive bias of 1 to 1.5V, such as 1.25 V and electrical current in a range from positive 10 to 60 arbitrary units (which depends on the size of the phase change memory pillar in the phase change memory device). A write operation can be performed with a negative bias of −1.75 to −3V, such as −2 V and electrical current in a range from negative 30 to negative 50 arbitrary units for a set operation, and electrical current in a range from negative 70 to negative 90 arbitrary units for a reset operation. Duration of the falling edge of the electrical bias pulse can further differentiate the set operation and the reset operation during programming. Read and write voltages and limiting currents can be determined by the integrated on-chip circuitry.

Figure 12:
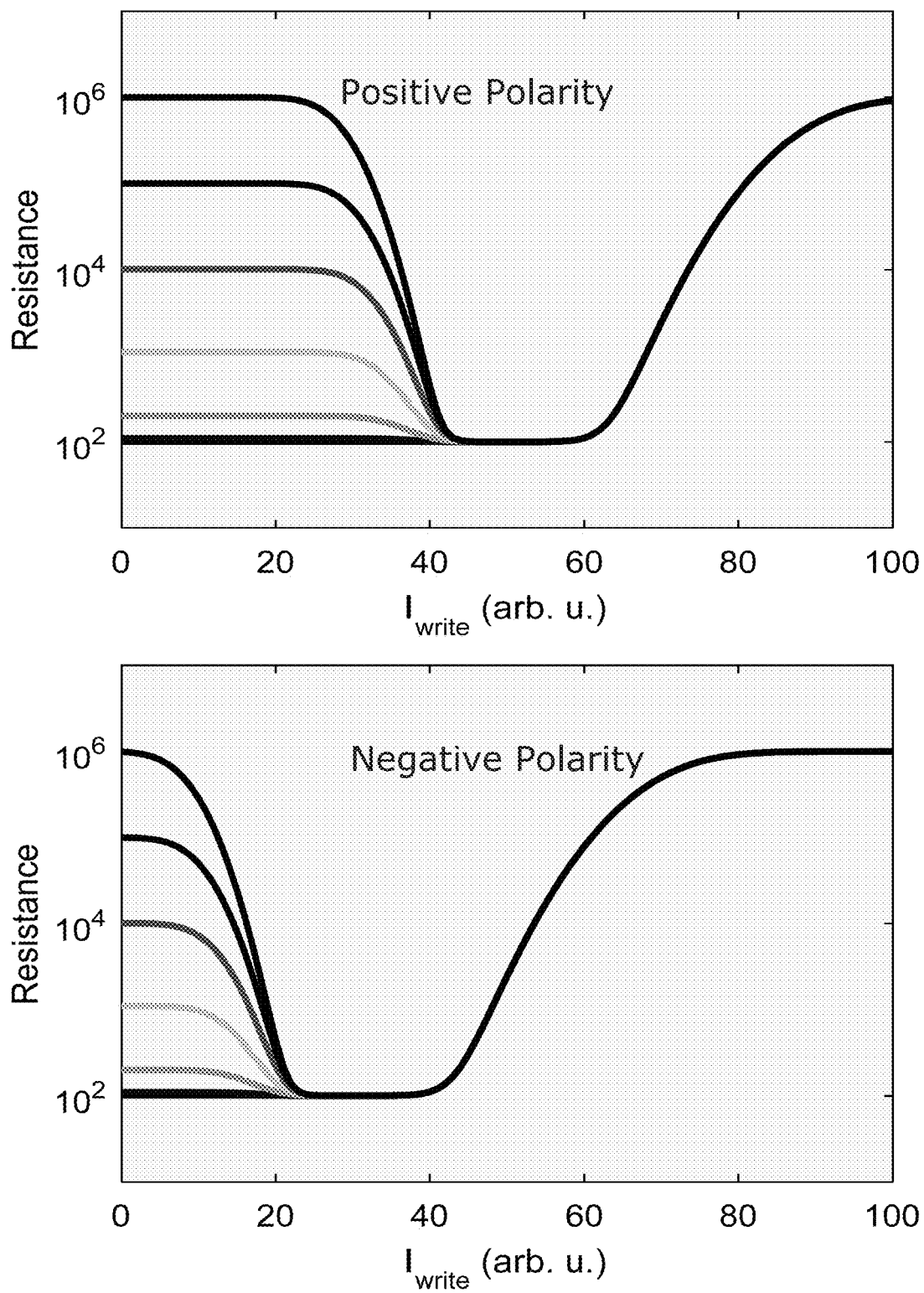
FIG. 12 are exemplary current-voltage characteristics of an exemplary phase change memory cell that is operated as a variable resistor according to an embodiment of the present disclosure.

Referring to FIG. 12, the asymmetric thermoelectric heat generation provided upon passing current through the phase change memory element (such as the first phase change memory material pillar 164) between a first junction 163 between the phase change memory element and the first electrode 162 and a second junction 165 between the phase change memory element and the second electrode 166 can be advantageously employed during usage of the phase change memory element as a variable resistor or as a multilevel or multibit memory cell (instead of a binary memory element). While six different states for the phase change memory element are illustrated in FIG. 12, it is understood that the phase change memory element can be operated to provide three or more discrete resistive states, or to provide continuous resistive states in which the analog resistance value of the phase change memory element functions as data. Such configurations can be employed for neuromorphic computing. Generally, the voltage bias polarity is different between the read operation and the programming operation. A programming operation in the negative polarity (i.e., the reverse bias condition) lowers the programming voltage, while a read operation in the positive polarity (i.e., the positive bias condition) increases the maximum read current that can flow through the phase change memory element. Thus, in the example of FIG. 12, the positive polarity read current can be in a range of positive 1 to positive 20 arbitrary units in the upper graph of FIG. 12, while the negative polarity write current can be in a range of negative 35 to negative 75 arbitrary units in the lower graph of FIG. 12.

Figure 13:
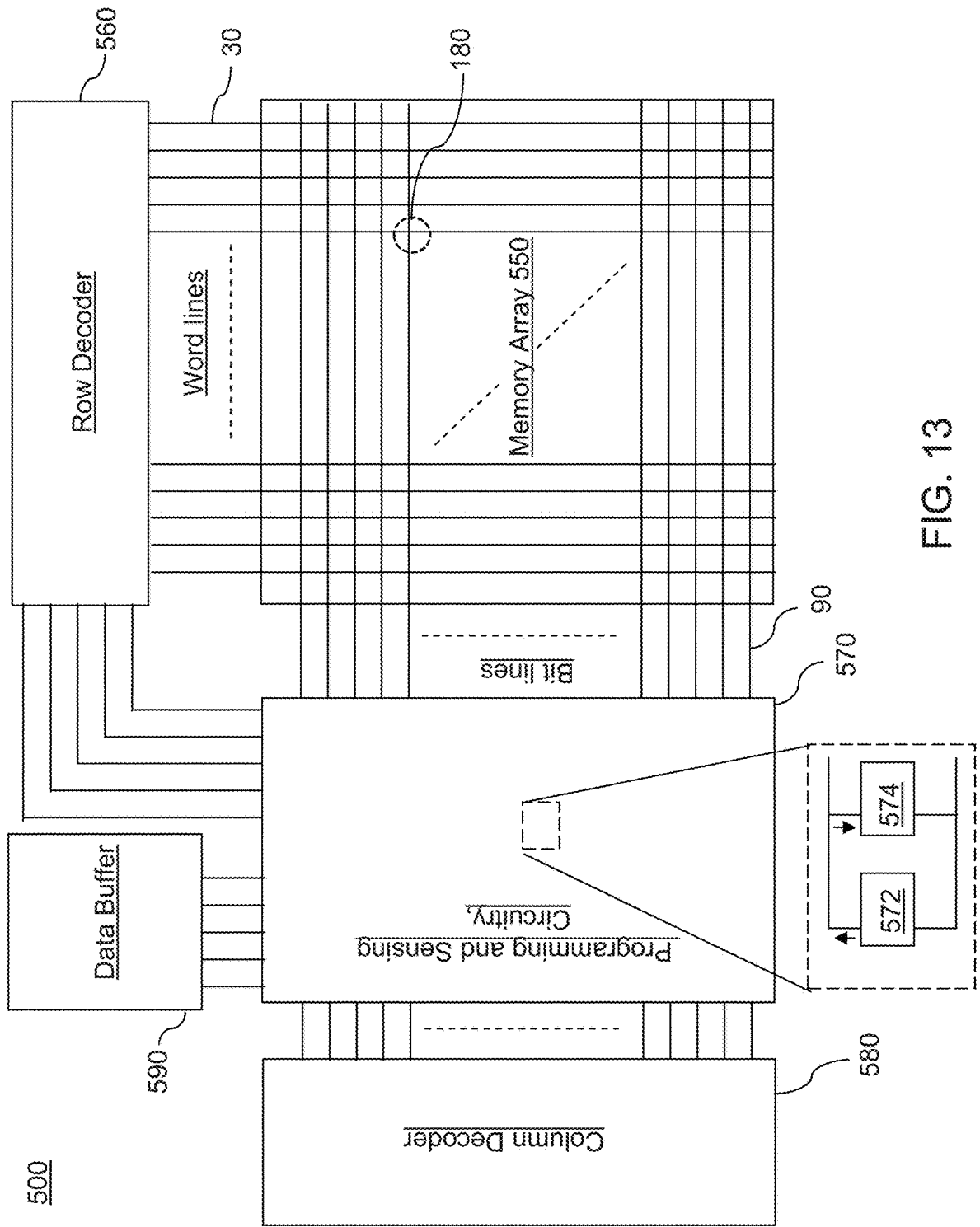
FIG. 13 is an exemplary circuit schematic of a phase change memory device including a two-dimensional or a three-dimensional array of phase change memory elements of the present disclosure.

In addition to the cross-point array configurations illustrated above, the phase change memory elements can be implemented in various other configurations including, but not limited to, a one-transistor one-resistor (1T1R) configuration in which a transistor is provided for each phase change memory element, a one-selector one-resistor (1S1R) configuration in which a selector element is provided for each phase change memory element, and a one-transistor multiple-resistor 1TNR configuration in which a single transistor is employed to access multiple phase change memory elements. Read and write currents and voltages are controlled by the integrated on-chip circuitry Referring to FIG. 13, a schematic diagram is shown for a non-volatile memory device including non-volatile memory cells of the present disclosure in an array configuration. The non-volatile memory device can be configured as a resistive random access memory device. As used herein, a "random access memory device" refers to a memory device including memory cells that allow random access, i.e., access to any selected memory cell upon a command for reading the contents of the selected memory cell. As used herein, a "resistive random access memory device" refers to a random access memory device in which the memory cells include a resistive memory element, such as a phase change memory cell 180 containing a phase change memory element 164.

The resistive random access memory device 500 of an embodiment of the present disclosure includes a memory array region 550 containing an array of the respective memory cells 180 located at the intersection of the respective word lines 30 and bit lines 90. The device 500 may also contain a row decoder 560 connected to the word lines 30, a programming and sensing circuitry 570 (e.g., a sense amplifier and other bit line control circuitry) connected to the bit lines 90, a column decoder 580 connected to the bit lines and a data buffer 590 connected to the sense circuitry. Multiple instances of the resistive memory cells 180 are provided in an array configuration that forms the random access memory device 500. The programming and sensing circuitry 570 can include a programming circuitry 572 configured to provide an electrical bias condition in a reverse (e.g., negative) bias mode, and a sensing circuitry 574 configured to provide an electrical bias condition in a forward (e.g., positive) bias mode. As used herein, an element is "configured to" perform a specific function if the element includes all necessary structural components and any necessary software to perform the specific function. It should be noted that the location and interconnection of elements are schematic and the elements may be arranged in a different configuration.

Each resistive memory cell 180 includes a resistive memory material having at least two different resistive states. The resistive memory material portion is provided between a first electrode 162 and a second electrode (166, 17) within each resistive memory cell 180. Each resistive memory cell 180 can include a first memory pillar structure (16, 14, 17), a second memory pillar structure (26, 24, 27), a third memory pillar structure (36, 34, 37), or any of the other phase change memory elements described above.

Referring to all drawings and various embodiments of the present disclosure, a phase change memory device is provided. The phase change memory device 500 comprises at least one phase change memory cell 180, wherein each of the at least one phase change memory cell 180 comprises a phase change memory element (e.g., phase change memory material pillar) 164 located between a first electrode 162 and a second electrode (166, 17) (e.g., 166), and wherein a first junction 163 between the phase change memory element 164 and the first electrode 162 and a second junction 165 between the phase change memory element 180 and the second electrode 166 have asymmetric thermoelectric heat generation upon heating of the phase change memory element 180. The phase change memory device 500 also includes programming and sensing circuitry 570 configured to flow a write current of a first polarity through a phase change memory element 164 of the at least one phase change memory cell 180, and a read current of a second polarity opposite to the first polarity through the phase change memory element 164 of the at least one phase change memory cell 180.

In one embodiment, the programming and sensing circuitry 570 is configured to flow the write current (e.g., a programming current, such as set current and/or reset current) from a first electrode 162 to a second electrode 166 through the phase change memory element 164 of a selected phase change memory cell 180 of the plurality of phase change memory cells 180 in a reverse bias mode during programming and to flow a read current (e.g., a sensing current) from the second electrode 166 to the first electrode 162 through the phase change memory element 164 of the selected phase change memory cell 180 in a forward bias mode during sensing.

In one embodiment, the asymmetric thermoelectric heat generation increases the magnitude of the minimum required current for amorphization of the phase change memory element 164 in the forward bias mode and decreases the magnitude of the minimum required current for amorphization of the phase change memory element 164 in the reverse bias mode.

In one embodiment, the magnitude of the minimum required programming current for amorphization of the phase change memory element in the forward bias mode is greater than the magnitude of the minimum required programming current for amorphization of the phase change memory element in the reverse bias mode by 20-100%, which can be a current in a range from 10 uA to 100 uA.

In one embodiment, the first electrode 162 comprises a first material having a first Seebeck coefficient at an elevated temperature; the second electrode 166 comprises a second material having a second Seebeck coefficient at the elevated temperature; and the first Seebeck coefficient at the elevated temperature is more positive than the second Seebeck coefficient at the elevated temperature which can be in a range from 200 degrees Celsius to 700 degrees Celsius. The elevated temperature herein refers to the characteristic temperature of the memory element during the write operation. As a proxy for the ranges of Seebeck coefficients in a temperature range from 200 degrees Celsius to 700 degrees Celsius, the Seebeck coefficients at the temperature of 300 degrees Celsius can be employed. In one embodiment, the first electrode 162 comprises a first material having a first Seebeck coefficient at 300 degrees Celsius; the second electrode 166 comprises a second material having a second Seebeck coefficient at 300 degrees Celsius; and the first Seebeck coefficient at 300 degrees Celsius is more positive than the second Seebeck coefficient at 300 degrees Celsius. For example, the first electrode 162 can include selenium, tellurium, silicon, germanium, or an alloy providing a Seebeck coefficient of at least 50 microvolts per Kelvin at 300 degrees Celsius, and preferably at least 300 microvolts per Kelvin at 300 degrees Celsius, and the second electrode 166 can include platinum, molybdenum, tungsten, tantalum, nickel, or any other material providing a Seebeck coefficient of at most 100 microvolts per Kelvin at 300 degrees Celsius, and preferably at most 50 microvolts per Kelvin at 300 degrees Celsius. It is understood that all Seebeck coefficients referenced herein are measured at 300 degrees unless otherwise specified. In one embodiment, a difference between the first Seebeck coefficient at 300 degrees Celsius and the second Seebeck coefficient at 300 degrees Celsius is at least 30 microvolts per Kelvin. In one embodiment, the phase change memory element 164 comprises a material having a greater Seebeck coefficient than the second electrode 166.

In one embodiment, the first junction 163 has a first thermal conductance and a second junction 165 has a second thermal conductance that is less than the first thermal conductance. In one embodiment, the first material has a first thermal conductivity at 300 degrees Celsius; the second material has a second thermal conductivity at 300 degrees Celsius; and that first thermal conductivity at 300 degrees Celsius is greater than the second thermal conductivity at 300 degrees Celsius at least by a factor of 2. In an illustrative example, the first material can include tungsten, molybdenum, ruthenium, silver, gold, copper, aluminum, tungsten nitride, or titanium nitride, and the second material can include tantalum nitride, titanium nitride, lead and/or an alloy of copper, or aluminum with another metal to provide a lesser thermal conductivity. It is understood that all references to thermal conductivity herein refer to the value of the thermal conductivity at 300 degrees Celsius unless otherwise specified. The temperature of 300 degrees Celsius represents the median temperature of a typical operational temperature range from 200 degrees Celsius to 700 degrees Celsius.

In one embodiment, the first electrode 162 and/or the second electrode 166 can include a respective material stack including at least two different materials. One material within each material stack can be employed to provide a desired Seebeck coefficient, and another material within each material stack can be employed to provide a desired thermal conductivity. All materials within the first electrode 162 and/or the second electrode 166 can be electrically conductive.

In one embodiment, a first surface of the phase change memory element 164 facing the first electrode 162 within each of the at least one phase change memory cell 180 has a first surface area; and a second surface of the phase change memory element 164 facing the second electrode (166 or 17) within each of the at least one phase change memory cell 180 has a second surface area; and the first surface area is greater than the second surface area at least by a factor of 2.

In one embodiment, each of the at least one phase change memory cell 180 comprises an ovonic threshold switch (as embodied in a first selector pillar 14) located on the second electrode 166 and comprising an ovonic threshold switch material having a lower thermal conductivity than a material of the first electrode 162.

In one embodiment, the at least one phase change memory cell 180 comprises a two-dimensional array of phase change memory cells 180 accessed by first access metal lines (such as the first conductive rails 12) and second access metal lines (such as the second conductive rails (18, 22)).

In one embodiment, each first electrode 162 is embodied as a metal contact structure located on a respective first access metal line 12; and each of the second electrode 17 is embodied as an electrically conductive contact structure contacting a respective ovonic threshold switch 14.

In one embodiment, each first access metal line 12 extends along a first direction hd1; each second access metal line (18, 22) extends along a second direction hd2 that is different from the first direction hd1; and the first access metal lines 12 and the second access metal lines (18, 22) are connected to the programming and sensing circuitry 570 in a configuration selected from: a first configuration in which the first access metal lines 12 are word lines and the second access metal lines (18, 22) are bit lines; and a second configuration in which the first access metal lines 12 are bit lines and the second access metal lines (18, 22) are word lines.

In one embodiment, each phase change memory cell (16, 14, 17) comprises an ovonic threshold switch 14 located on the second electrode 166 of the phase change memory cell (16, 14, 17); and the ovonic threshold switch 14 comprises an ovonic threshold switch material having a lower thermal conductivity than a material of the first electrode 162.

In one embodiment, each phase change memory cell (16, 14, 17) comprises a barrier plate 17 contacting a respective ovonic threshold switch 14 and one of the second access metal lines (18, 22).

In one embodiment, the phase change memory element 164 has a tapered sidewall surface having a taper angle between 15 degrees to 40 degrees, and an area of the first junction 163 is at least 50% larger than, and may be greater than twice, an area of the second junction 165. In one embodiment, the phase change memory element 164 with the tapered sidewall surface has a first contact area with the first electrode 162, and a second contact area with the second electrode 166; and the first contact area is at least 50% larger than, and may be greater than twice, the second contact area. In one embodiment, the first electrode 162 has a pillar shape having a uniform thickness along a direction perpendicular to an interface with the phase change memory element 164 within each phase change memory cell 180.

In one embodiment, the first electrode 162 has a higher thermal conductivity than materials of the second electrode 166; and the first electrode 162 has a Seebeck coefficient at 300 degrees Celsius that is more positive than Seebeck coefficients at 300 degrees Celsius of materials of the second electrode 166.

In one embodiment, the phase change memory device comprises a three-dimensional array of phase change memory cells 180 that includes a vertical stack of multiple two-dimensional arrays of phase change memory cells {(16, 14, 17), (26, 24, 27), (36, 34, 37)}; each two-dimensional array of phase change memory cells {(16, 14, 17), (26, 24, 27), (36, 34, 37)} is accessed by respective lower metal lines {12, (18, 22), (28, 32)} and respective upper metal lines {(18, 22), (28, 32), 38} that extend along different horizontal directions (hd1, hd2); and upper access metal lines (18, 28) of an underlying two-dimensional array of phase change memory cells {(16, 14, 17), (26, 24, 27), (36, 34, 370)} are merged with lower access metal lines (22, 32) of an overlying two-dimensional array of phase change memory cells {(16, 14, 17), (26, 24, 27), (36, 34, 37)}.

In one embodiment, each phase change memory element (164, 264, 364) is a variable resistor and the programming and sensing circuitry generates 570 an output representing a resistance value of a selected phase change memory element (164, 264, 364). Thus, the read current represents a resistance value of a selected phase change memory element (164, 264, 364).

The various configurations of the resistive memory cells 180 of the present disclosure provide many advantageous features, non-limiting examples of which include reduction in read disturb during read operations and reduction in the write current and power consumption during programming operations.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A phase change memory device, comprising:
at least one phase change memory cell, wherein each of the at least one phase change memory cell comprises a phase change memory element located between a first electrode and a second electrode, and wherein a first junction between the phase change memory element and the first electrode and a second junction between the phase change memory element and the second electrode have asymmetric thermoelectric heat generation upon passing electrical current through the phase change memory element; and
a programming and sensing circuitry configured to flow a write current of a first polarity through the phase change memory element of the at least one phase change memory cell, and a read current of a second polarity opposite to the first polarity through the phase change memory element of the at least one phase change memory cell;
wherein:
the at least one phase change memory cell comprises a plurality of phase change memory cells;
the programming and sensing circuitry is configured to flow the write current from the first electrode to the second electrode through the phase change memory element of a selected phase change memory cell of the plurality of memory cells in a reverse bias mode during programming, and to flow a read current from the second electrode to the first electrode through the phase change memory element of the selected phase change memory cell in a forward bias mode during sensing;
the asymmetric thermoelectric voltage generation increases a magnitude of a minimum required programming current for amorphization of the phase change memory element in the forward bias mode and decreases the magnitude of the minimum required programming current for amorphization of the phase change memory element in the reverse bias mode; and
the magnitude of the minimum required programming current for amorphization of the phase change memory element in the forward bias mode is greater than the magnitude of the minimum required programming current for amorphization of the phase change memory element in the reverse bias mode by 10-100%.

2. A phase change memory device, comprising:
at least one phase change memory cell, wherein each of the at least one phase change memory cell comprises a phase change memory element located between a first electrode and a second electrode, and wherein a first junction between the phase change memory element and the first electrode and a second junction between the phase change memory element and the second electrode have asymmetric thermoelectric heat generation upon passing electrical current through the phase change memory element; and
a programming and sensing circuitry configured to flow a write current of a first polarity through the phase change memory element of the at least one phase change memory cell, and a read current of a second polarity opposite to the first polarity through the phase change memory element of the at least one phase change memory cell;
wherein:
the at least one phase change memory cell comprises a plurality of phase change memory cells;
the programming and sensing circuitry is configured to flow the write current from the first electrode to the second electrode through the phase change memory element of a selected phase change memory cell of the plurality of memory cells in a reverse bias mode during programming, and to flow a read current from the second electrode to the first electrode through the phase change memory element of the selected phase change memory cell in a forward bias mode during sensing;
the first electrode comprises a first material having a first Seebeck coefficient at 300 degrees Celsius;
the second electrode comprises a second material having a second Seebeck coefficient at 300 degrees Celsius; and
the first Seebeck coefficient at 300 degrees Celsius is more positive than the second Seebeck coefficient at 300 degrees Celsius.

3. The phase change memory device of claim 2, wherein:
a difference between the first Seebeck coefficient at 300 degrees Celsius and the second Seebeck coefficient at 300 degrees Celsius is at least 30 microvolts per Kelvin;
the phase change memory element comprises a material having a greater Seebeck coefficient than the second electrode;
the first junction has a first thermal conductance and a second junction has a second thermal conductance that is less than the first thermal conductance;
the first material has a first thermal conductivity at 300 degrees Celsius;
the second material has a second thermal conductivity at 300 degrees Celsius; and
the first thermal conductivity at 300 degrees Celsius is greater than the second thermal conductivity at 300 degrees Celsius at least by a factor of 2.

4. The phase change memory device of claim 2, wherein each of the at least one phase change memory cell contains an ovonic threshold switch.

5. The phase change memory device of claim 2, wherein:
the phase change memory element has a tapered sidewall surface having a taper angle between 15 degrees to 40 degrees; and
an area of the first junction is at least 50% larger than an area of the second junction.

6. A phase change memory device, comprising:
at least one phase change memory cell, wherein each of the at least one phase change memory cell comprises a phase change memory element located between a first electrode and a second electrode, and wherein a first junction between the phase change memory element and the first electrode and a second junction between the phase change memory element and the second electrode have asymmetric thermoelectric heat generation upon passing electrical current through the phase change memory element; and
a programming and sensing circuitry configured to flow a write current of a first polarity through the phase change memory element of the at least one phase change memory cell, and a read current of a second polarity opposite to the first polarity through the phase change memory element of the at least one phase change memory cell;

wherein:

the at least one phase change memory cell comprises a plurality of phase change memory cells;

the programming and sensing circuitry is configured to flow the write current from the first electrode to the second electrode through the phase change memory element of a selected phase change memory cell of the plurality of memory cells in a reverse bias mode during programming, and to flow a read current from the second electrode to the first electrode through the phase change memory element of the selected phase change memory cell in a forward bias mode during sensing;

the phase change memory element has a tapered sidewall surface having a taper angle between 15 degrees to 40 degrees;

an area of the first junction is at least 50% larger than an area of the second junction;

the first electrode has a higher thermal conductivity than the second electrode; and the first electrode has a Seebeck coefficient at 300 degrees Celsius that is more positive than Seebeck coefficient at 300 degrees Celsius of the second electrode.

7. The phase change memory device of claim 2, wherein:

the phase change memory device comprises a three-dimensional array of phase change memory cells that includes a vertical stack of multiple two-dimensional arrays of phase change memory cells;

each two-dimensional array of phase change memory cells is accessed by respective lower metal lines and respective upper metal lines that extend along different horizontal directions; and upper access metal lines of an underlying two-dimensional array of phase change memory cells are merged with lower access metal lines of an overlying two-dimensional array of phase change memory cells.

8. The phase change memory device of claim 2, wherein the at least one phase change memory element is a variable resistor and the programming and sensing circuitry generates an output representing a resistance value of a selected phase change memory element.

9. A method of operating a phase change memory device, comprising:

flowing a write current of a first polarity through a phase change memory element of a selected phase change memory cell; and flowing a read current of a second polarity opposite to the first polarity through the phase change memory element of the selected phase change memory cell, wherein:

a first junction between the phase change memory element and a first electrode and a second junction between the phase change memory element and a second electrode exhibit asymmetric thermoelectric heat generation during the step of flowing the write current;

the selected phase change memory cell is one of a plurality of phase change memory cells;

the write current flows from the first electrode to the second electrode through the phase change memory element of the selected phase change memory cell in a reverse bias mode;

the read current from the second electrode to the first electrode through the phase change memory element of the selected phase change memory cell in a forward bias mode;

the asymmetric thermoelectric voltage generation increases a magnitude of a minimum required programming current for amorphization of the phase change memory element in the forward bias mode and decreases the magnitude of the minimum required programming current for amorphization of the phase change memory element in the reverse bias mode; and the magnitude of the minimum required programming current for amorphization of the phase change memory element in the forward bias mode is greater than the magnitude of the minimum required programming current for amorphization of the phase change memory element in the reverse bias mode by a percentage in a range from 10% to 100%.

10. A method of operating a phase change memory device, comprising:

flowing a write current of a first polarity through a phase change memory element of a selected phase change memory cell; and flowing a read current of a second polarity opposite to the first polarity through the phase change memory element of the selected phase change memory cell, wherein:

a first junction between the phase change memory element and a first electrode and a second junction between the phase change memory element and a second electrode exhibit asymmetric thermoelectric heat generation during the step of flowing the write current;

the selected phase change memory cell is one of a plurality of phase change memory cells;

the write current flows from the first electrode to the second electrode through the phase change memory element of the selected phase change memory cell in a reverse bias mode;

the read current from the second electrode to the first electrode through the phase change memory element of the selected phase change memory cell in a forward bias mode;

the first electrode comprises a first material having a first Seebeck coefficient at 300 degrees Celsius;

the second electrode comprises a second material having a second Seebeck coefficient at 300 degrees Celsius; and the first Seebeck coefficient at 300 degrees Celsius is more positive than the second Seebeck coefficient at 300 degrees Celsius.

11. The method claim 10, wherein:

a difference between the first Seebeck coefficient at 300 degrees Celsius and the second Seebeck coefficient at 300 degrees Celsius is at least 30 microvolts per Kelvin;

the phase change memory element comprises a material having a greater Seebeck coefficient than the second electrode;

the first junction has a first thermal conductance and a second junction has a second thermal conductance that is less than the first thermal conductance;

the first material has a first thermal conductivity at 300 degrees Celsius;

the second material has a second thermal conductivity at 300 degrees Celsius; and the first thermal conductivity at 300 degrees Celsius is greater than the second thermal conductivity at 300 degrees Celsius at least by a factor of 2.

12. The method claim 10, wherein the selected phase change memory cell further comprises an ovonic threshold switch.

13. The method claim 10, wherein:

the phase change memory element has a tapered sidewall surface having a taper angle between 15 degrees to 40 degrees; and an area of the first junction is at least 50% larger than an area of the second junction.

14. A method of operating a phase change memory device, comprising:

flowing a write current of a first polarity through a phase change memory element of a selected phase change memory cell; and flowing a read current of a second polarity opposite to the first polarity through the phase change memory element of the selected phase change memory cell, wherein:

a first junction between the phase change memory element and a first electrode and a second junction between the phase change memory element and a second electrode exhibit asymmetric thermoelectric heat generation during the step of flowing the write current;

the selected phase change memory cell is one of a plurality of phase change memory cells;

the write current flows from the first electrode to the second electrode through the phase change memory element of the selected phase change memory cell in a reverse bias mode;

the read current from the second electrode to the first electrode through the phase change memory element of the selected phase change memory cell in a forward bias mode;

the phase change memory element has a tapered sidewall surface having a taper angle between 15 degrees to 40 degrees;

an area of the first junction is at least 50% larger than an area of the second junction;

the first electrode has a higher thermal conductivity than the second electrode; and the first electrode has a Seebeck coefficient at 300 degrees Celsius that is more positive than Seebeck coefficient at 300 degrees Celsius of the second electrode.

15. The method claim 10, wherein:

the phase change memory device comprises a three-dimensional array of phase change memory cells that includes a vertical stack of multiple two-dimensional arrays of phase change memory cells;

each two-dimensional array of phase change memory cells is accessed by respective lower metal lines and respective upper metal lines that extend along different horizontal directions; and upper access metal lines of an underlying two-dimensional array of phase change memory cells are merged with lower access metal lines of an overlying two-dimensional array of phase change memory cells.

16. The method claim 10, wherein the selected phase change memory element is a variable resistor, and the read current represents a resistance value of a selected phase change memory element.

* * * * *